United States Patent
Nguyen et al.

(10) Patent No.: US 11,157,037 B1
(45) Date of Patent: Oct. 26, 2021

(54) METHOD AND DEVICE FOR CLOCK GENERATION AND SYNCHRONIZATION FOR TIME INTERLEAVED NETWORKS

(71) Applicant: MARVELL ASIA PTE, LTD., Singapore (SG)

(72) Inventors: Ray Luan Nguyen, San Jose, CA (US); Geoffrey O. Hatcher, San Jose, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 17/097,791

(22) Filed: Nov. 13, 2020

(51) Int. Cl.
*G06F 1/08* (2006.01)
*G06F 1/06* (2006.01)

(52) U.S. Cl.
CPC .............. *G06F 1/08* (2013.01); *G06F 1/06* (2013.01)

(58) Field of Classification Search
CPC ..................................... G06F 1/08; G06F 1/06
USPC ........................................................ 327/144
See application file for complete search history.

(56) References Cited

U.S. PATENT DOCUMENTS

| | | | | |
|---|---|---|---|---|
| 2014/0040700 | A1* | 2/2014 | Kobori | G06F 5/015 714/763 |
| 2020/0059222 | A1* | 2/2020 | Cheung | H03H 17/0275 |
| 2020/0319893 | A1* | 10/2020 | Wilkinson | G06F 9/4405 |
| 2020/0349420 | A1* | 11/2020 | Ovsiannikov | G06F 9/30032 |

* cited by examiner

*Primary Examiner* — Tomi Skibinski

(57) ABSTRACT

A multi-layer time-interleaving (TI) device and method of operation therefor. This device includes a plurality of TI layers configured to receive a plurality of input clock signals and to output a plurality of output clock signals, each of which can be configured to drive subsequent devices. The layers include at least a first and second layer including a fine-grain propagation device and a barrel-shifting propagation device configured to retime the plurality of input clock signals to produce divided output clock signals. The device can include additional barrel-shifting propagation devices to time interleave an initial two layers to produce one or more additional layers. Using negative phase stepping, the plurality of output clock signals is produced with optimal timing margin and synchronized on a single clock edge.

20 Claims, 20 Drawing Sheets

| Col >><br>Row | $N_j - 1$ | ... | 2 | 1 | 0 |
|---|---|---|---|---|---|
| $K_j - 1$ | $(c_{K_j-2, N_j-1} + N_i)\%N_{i+1}$ | ... | $(c_{K_j-2, 2} + N_i)\%N_{i+1}$ | $(c_{K_j-2, 1} + N_i)\%N_{i+1}$ | $(c_{K_j-2, 0} + N_i)\%N_{i+1}$ |
| ... | ... | ... | ... | ... | ... |
| 1 | $(c_{0, N_j-1} + N_i)\%N_{i+1}$ | ... | $(c_{0,2} + N_i)\%N_{i+1}$ | $(c_{0,1} + N_i)\%N_{i+1}$ | $(c_{0,0} + N_i)\%N_{i+1}$ |
| 0 | $(c_{0,N_j-2} + i_{N_j-3} - i_{N_j-2} + N_i)\%N_{i+1}$ | ... | $(c_{0,2} + i_2 - i_1 + N_i)\%N_{i+1}$ | $(c_{0,0} + i_1 - i_0 + N_i)\%N_{i+1}$ | $c_{0,0} = x$ |
| Index | $i_{N_j-1}$ | ... | $i_2$ | $i_1$ | $i_0$ |

FIG. 13A

| Col >><br>Row | $N_1 - 1$ | ... | 2 | 1 | 0 |
|---|---|---|---|---|---|
| $K_1 - 1$ | $(x+(N_1-1)(N_1-p)+(K_1-1)N_1)\%N_{i+1}$ | ... | $(x+2(N_1-p)+(K_1-1)N_1)\%N_{i+1}$ | $(x-p+(K_1-1)N_1)\%N_{i+1}$ | $(x+(K_1-1)N_1)\%N_{i+1}$ |
| ... | ... | ... | ... | ... | ... |
| 1 | $(x+(N_1-1)(N_1-p)+N_1)\%N_{i+1}$ | ... | $(x+2(N_1-p)+N_1)\%N_{i+1}$ | $(x-p+2N_1)\%N_{i+1}$ | $(x+N_1)\%N_{i+1}$ |
| 0 | $(x+(N_1-1)(N_1-p))\%N_{i+1}$ | ... | $(x+2(N_1-p))\%N_{i+1}$ | $(x-p+N_1)\%N_{i+1}$ | x |
| Index | $i_{N_1-1}$ | ... | $i_2$ | $i_1$ | $i_0$ |

METHOD AND DEVICE FOR CLOCK GENERATION AND SYNCHRONIZATION FOR TIME INTERLEAVED NETWORKS

CROSS-REFERENCES TO RELATED APPLICATIONS

N/A

BACKGROUND OF THE INVENTION

The present invention generally relates to communication systems and integrated circuit (IC) devices. More specifically, the present invention provides for a method and device for clock generation and synchronization for time interleaved (TI) networks.

Over the last few decades, the use of communication networks has exploded. In the early days of the Internet, popular applications were limited to emails, bulletin boards, and mostly informational and text-based web page surfing. The amount of data transferred by such applications was relatively small. Today, the Internet and mobile applications demand a huge amount of bandwidth for transferring photo, video, music, and other multimedia files. For example, a social networking platform can process more than 500 TB of data daily. With such high demands on data storage and data transfer, existing data communication systems need to be improved to address these needs.

To address the rapidly rising demand for greater operational speed and data throughput, clocking architectures need to evolve and adapt to exploit every aspect of technological advantage while keeping power commensurate with scaling trends. Time interleaving involves simultaneously processing signal data through a plurality of parallel channels configured to a defined clocking relationship to produce a combined output at a greater effective rate. However, efficient time interleaving networks are difficult to design due to nonlinearities, gain/offset mismatches, timing errors, etc.

There have been many conventional types of methods and devices for TI networks.

Unfortunately, such conventional methods and devices suffer from various drawbacks, including increased chip area, production cost, power consumption, etc. Therefore, improved communication systems with devices and methods using more efficient TI networks are highly desired.

BRIEF SUMMARY OF THE INVENTION

The present invention generally relates to communication systems and integrated circuit (IC) devices. More specifically, the present invention provides for a method and device for clock generation and synchronization for time interleaved networks. Merely by way of example, the present invention is applied to analog-to-digital conversion (ADC) applications. However, the present invention has a much broader range of applicability, such as for digital-to-analog (DAC) conversion, parallel computing, optical applications, serializer/deserializer (SerDes) applications, and the like.

In an example, the present invention provides a multi-layer TI system. This system includes a plurality of TI layers configured to receive a plurality of input clock signals and to output a plurality of output clock signals, each of which can be sent to subsequent devices (e.g., sub-converters and the like). The plurality of TI layers comprises at least a first layer including a fine-grain propagation device and a second layer including a barrel-shifting propagation device.

The fine-grain propagation device includes a divider and a first plurality of retimers. The divider receives the plurality of input signals and produces a plurality of divided clock signals, which are each retimed by the first plurality of retimers using the plurality of input signals to produce a plurality of fine-grain clock signals characterized by −p phase stepping.

The barrel shifting propagation device includes a plurality of propagation retimer chains, each of the propagation retimer chains including a plurality of propagation retimers coupled in series. Each of the plurality of propagation retimer chains is configured to receive one of the plurality of fine-grain clock signals and to produce a plurality of barrel-shifted clock signals from the particular fine-grain clock signal. The plurality of output clock signals includes the plurality of fine-grain clock signals and all pluralities of barrel-shifted clock signals derived from each of the plurality of fine-grain clock signals.

In an example, the multi-layer TI system discussed previously can include an interface retimer device configured to synchronize all of the outputs from the fine-grain propagation device and the barrel-shifting propagation device (i.e., the plurality of fine-grain clock signals and all pluralities of barrel-shifted clock signals derived from each of the plurality of fine-grain clock signals), which are synchronized properly in time. All of these output clock signals are received by a plurality of interleavers or sub-converters coupled to the fine-grain propagation and barrel-shifting devices. The interface retimer device is coupled to the interleavers or sub-converters and is configured to synchronize all the outputs in the correct order and updated on a single clock edge using staggered resampling and −p phase stepping as described above.

In an example, the multi-layer TI system can include additional fine-grain propagation devices to produce additional fine-grain layers (i.e., additional dimensions of fine-grain clocks) and/or include additional barrel-shifting propagation to produce one or more additional barrel-shifted layers (i.e., additional dimensions of barrel-shifted clocks). In a specific example, each of the divider output clocks from the fine-grain layers of the TI system are coupled to a barrel-shifting device. Each of these barrel-shifting devices includes a propagation retimer chain having a number of propagation retimers corresponding to the number of additional higher dimensions. Those of ordinary skill in the art will recognize other variations, modifications, and alternatives.

In an example, the interface retimer device is configured to synchronize all data outputs for each layer (which can include additional dimensions of fine-grain clocks and/or barrel-shifting clocks) of the multi-layer TI system. Then, a digital timing logic (DTL) device coupled to the interface retimer device is configured to synchronize the data from all layers of the multi-layer TI system in a data packet. By outputting the resulting synchronized data packet, the TI system provides a simple interface to external devices and systems.

Many benefits are recognized through various embodiments of the present invention. Such benefits include more efficient TI systems and methods with synchronous outputs compared to convention TI systems and methods, improved re-timing margins using negative phase stepping, and a highly scalable architecture for multi-layer and multi-instance TI systems. Depending upon the embodiment, the techniques implemented in the present invention are also cost-effective and relatively simple to implement. Other such benefits will be recognized by those of ordinary skill in the art.

The present invention achieves these benefits and others in the context of known IC fabrication processes. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 13A is a simplified table representing a general strategy for layer-to-layer synchronization in a TI system according to an example of the present invention;

FIG. 13B is a simplified table representing a general strategy with fixed −p phase relationship for layer-to-layer synchronization in a TI system according to an example of the present invention;

DETAILED DESCRIPTION OF THE INVENTION

Figure 1:
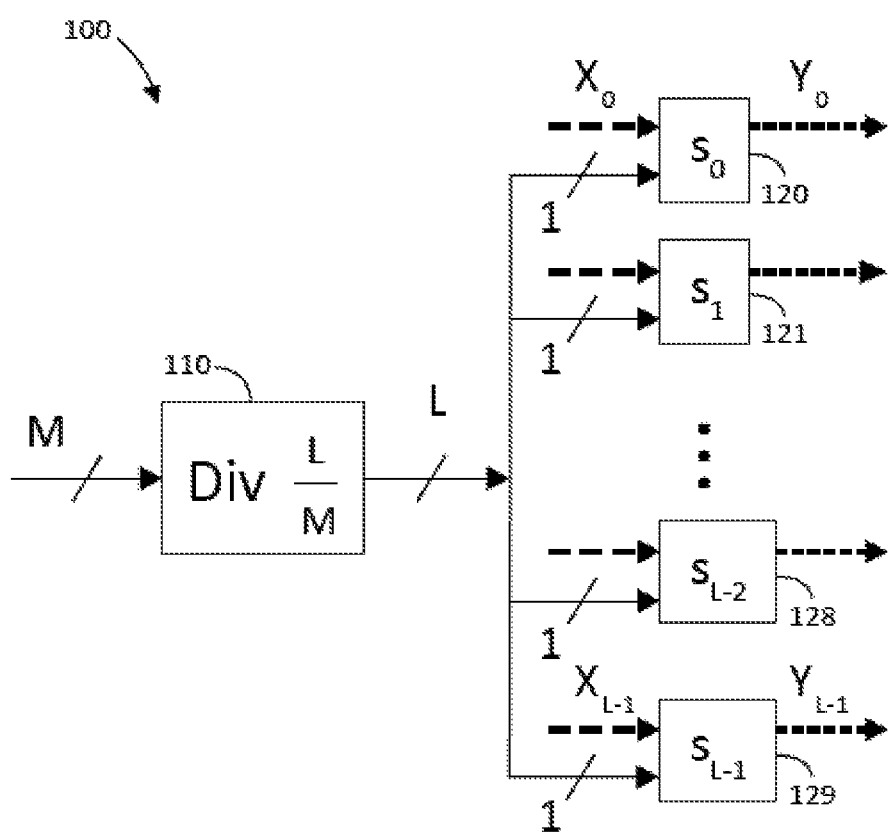
FIG. 1 is a simplified block diagram illustrating a 2D TI conversion system according to a conventional example.

The present invention generally relates to communication systems and integrated circuit (IC) devices. More specifically, the present invention provides for a method and device for clock generation and synchronization for time interleaved networks. Merely by way of example, the present invention is applied to analog-to-digital conversion (ADC) applications. However, the present invention has a much broader range of applicability, such as for digital-to-analog (DAC) conversion, parallel computing, optical applications, serializer/deserializer (SerDes) applications, and the like.

As technology progresses and the need to push data throughput continues to rapidly rise, systems in ICs nearly double their sampling rates at every new generation and technological node. To enable such rapid rise in operational speed, be it computing or data conversion, clocking architectures need to evolve and adapt to exploit every aspect of technological advantage while keeping power commensurate with scaling trends. According to an example, the present invention aims to devise fundamental clocking and synchronization techniques for massively time-interleaving (TI) structures.

The present disclosure seeks to describe a generalized approach to designing an efficient TI system for any computing or conversion network that requires clock generation and synchronization of signals or data, analog or digital. As an example, this general architecture can be applied to interleaved data computing application such as time interleaved multi-core processors or parallel graphical processing units (GPUs), conversion application such as those that employ Successive Approximation Register (SAR), pipelined, multi-step, hybrid, flash, time-to-digital, or any type of signal computing or conversion where the input is of any format and the output is of the same or entirely different types. The main objective is to enable simultaneous sub-computers or sub-converters to operate in a robust time-interleaved fashion while ultimately ensuring that their output be produced in a perfectly aligned fashion. For the sake of ease in description, such computers/converters shall be referred to as sub-converters, denoting the principal nature and functionality of these blocks, which is to apply transformation of inputs to create new synchronized outputs. The action of computing or conversion shall be denoted the same as conversion. Examples given here have the tendency to refer more to ADC examples, but the key approach applies generally to all types of signal conversion or computation.

The present invention provides several methods and devices using techniques to create an efficient TI conversion system with synchronous outputs. The order of these steps is not necessarily mandated and any of the steps can be omitted, shuffled or modified depending on the applications and skills of the individual practicing the art. Nevertheless, examples of the present invention shall generalize in any and all interleaving scenarios or systems with synchronous outputs. Further details of various examples of the present invention are discussed below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counterclockwise have been used for convenience purposes only and are not intended to imply any particular fixed direction. Instead, they are used to reflect relative locations and/or directions between various portions of an object.

Generalized Hierarchical Clock Generation:

For any general TI conversion system with L sub-converters, the input clocks can be defined as consisting of M phases (e.g., M>=1). As an example, in a trivial two-dimensional (2D) system, where input loading is not a concern, the M phases can be directly divided to create L clocks driving the L sub-converters.

FIG. 1 is a simplified block diagram illustrating a 2D TI conversion system 100 according to a conventional example. As shown, system 100 includes a divider device 110 configured to receive input clocks having M phases. The solid arrow paths that follow denote clock signals that propagate from the divider 110 (Div L/M) to L sub-converters 120 ($s_0$), 121 ($s_1$), ..., 128 ($s_{L-2}$), and 129 ($s_{L-1}$). The dotted arrows denote signal flow from the inputs ($X_i$) to the sub-converters to the outputs ($Y_i$). Here, there is a total of L inputs ($X_0, \ldots, X_{L-1}$) and L outputs ($X_0, \ldots, X_{L-1}$). Note that these signals can be tensors of any nature (analog, digital, mixed, etc.) and of any arbitrary dimension (e.g., $X_i \in R^{n1 \times n2 \times \cdots \times nr}$). Also, the dimensions of $Y_i$ do not necessarily match that of $X_i$.

Figure 2:
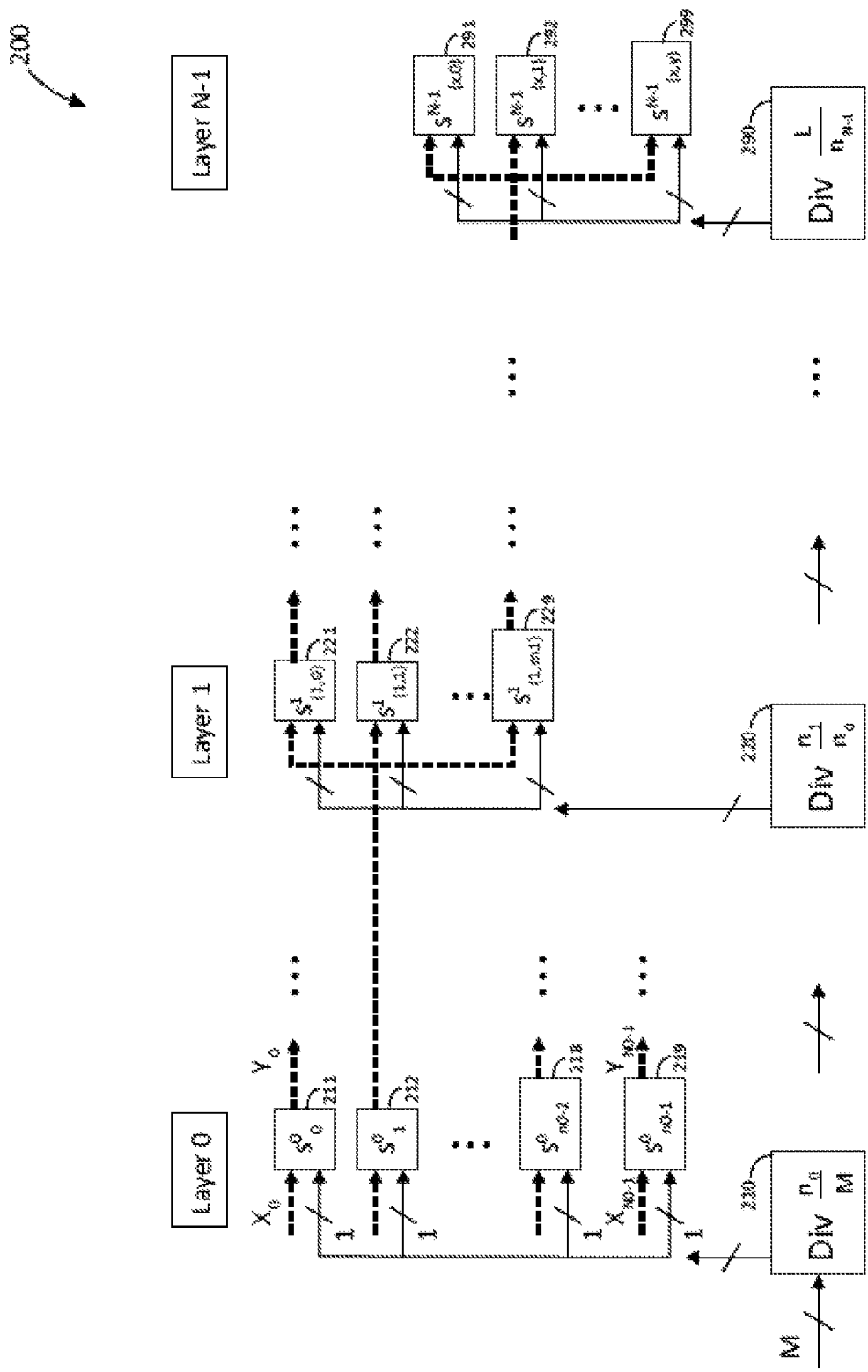
FIG. 2 is a simplified block diagram illustrating a N-layer interleaving system according to an example of the present invention.

Following the same principles, system 100 can be extended to an N-dimensional or N-layer interleaving system. FIG. 2 is a simplified block diagram illustrating a N-layer interleaving system 200 according to an example of the present invention. In an N-dimensional interleaving system, each sub-block $s^k_i$ (i.e., position i of layer k) drives its own fanout (FO) subsets in the next interleaving layer. Note that the term "drive" is used to imply that these signals/clocks originate from a certain source and does not necessarily mean that the source physically or directly drives these loads, as there can be other circuitries or nodes between them. As shown, TI system 200 includes a plurality of dividers 210, 220, ..., 290, and each of these dividers drives a plurality of sub-converters: divider 210 is shown driving sub-converters 211, 212, ..., 218, and 219 (layer 0); divider 220 is shown driving sub-converters 221, 222, ..., 229 (layer 1); and divider 290 is shown driving sub-converters 291, 292, ..., 299 (layer N−1). For example, from layer 0 to layer 1, divider 212 ($s^0_1$) drives its own subset of sub-converters including $s^1_{(1,0)}, \ldots, s^1_{(1,m1)}$; the next divider ($s^0_2$) drives its own subset (not shown in FIG. 2) including $s^1_{(2,0)}, s^1_{(2,m2)}$; and so on. In this fashion, when progressing from layer 0 to layer N−1, the dimension of the latter layer will grow in such a way that satisfies the following equation:

$$L = M \times K_0 \times K_1 \times K_2 \times \ldots \times K_i \times \ldots \times K_{N-1} \quad (1)$$

where $K_i$ denotes the effective fanout of all elements from layer i to layer i+1.

For example, to design a 2D system with L=16 sub-converters, there can be the following design choices:

$$L = 1 \times 16 = 2 \times 8 = 4 \times 4 = 8 \times 2 = 2 \times 2 \times 2 \times 2 = 2 \times 2 \times 4 = 2 \times 4 \times 2 = 4 \times 2 \times 2$$

Thus, the number of possible designs equals all possible permutations of smallest common factors of L and their combinatory products. In the case of L=16, there are exactly 8 possible designs.

Figure 3B:
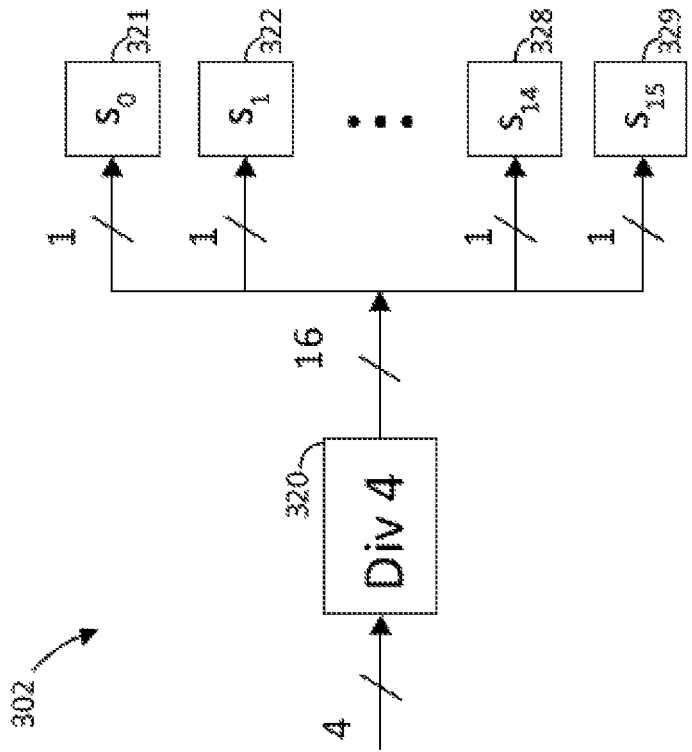
FIGS. 3A and 3B are a simplified block diagrams of 2D TI systems according to conventional examples.
Figure 3A:
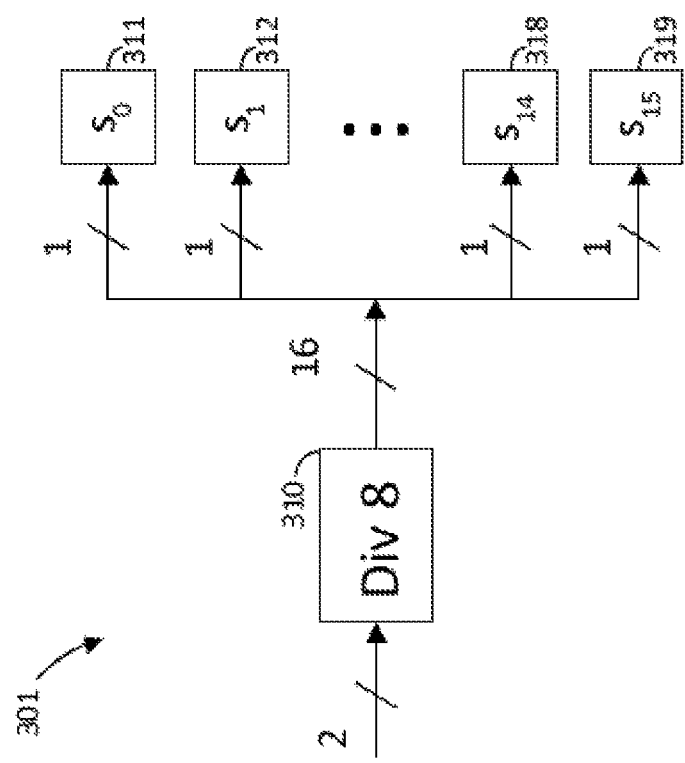

Phase Relationship Throughout Interleaving Structure:

At each TI layer, the divider ratio depends on both the numbers of input phases and output phases. To illustrate, two 2D examples are given in FIGS. 3A and 3B. FIGS. 3A and 3B are a simplified block diagrams of 2D TI systems 301 and 302 according to conventional example. As shown, there are L=16 sub-converters and the input clock has either M=2 phases (system 301) or M=4 phases (system 302). Here, the M clock phases can be divided by L/M (i.e., 8 using the divider 310 for system 301, and divided by 4 using the divider 320 for system 302) to generate the required 16 clocks for all of the lowest sub-converters (sub-converters 311, 312, ..., 318, and 319 for system 301; sub-converters 321, 322, ..., 328, and 329 for system 302). In both approaches, the same 16 clocks will be generated with similar phase relationships. The only difference is that the 2 input clocks of system 301 will be running at twice the speed of the 4 input clocks for system 302. The choice between these approaches can depend on the desired tradeoffs in a particular system application.

In state-of-the-art scenarios, one-step clock generation is often undesirable for several reasons. First, the input loading is typically important to the system bandwidth; hence, we cannot attach or load all L sub-converters to the input node without significantly overloading the input driver. Second, the edge rates and mismatches of all L clocks in the context of high-speed sampling are critical factors that must be optimized for low skew mismatches and jitters. The more clocks to maintain upfront for low jitters and skew mismatches, the more expensive the power consumption. Third, front-loading the system input with many critical clocks can complicate clock routing and layout tremendously due to the need to fit many wires within a small physical area. For these reasons, examples of high-speed TI networks according to the present invention typically have 2 or more levels of clocking generation. For ease of visualization and illustration, many of the examples discussed involve a TI system with N=2 layers. Nevertheless, the architecture steps described herein apply to any general TI system of any arbitrary N layers.

In an example, the present invention provides a system with M input phases that fans out to L lowest level interleavers. In a specific example, the number of interleaving levels N is chosen to satisfy the following frequency relationship that expresses the phase division from top (level 0) to bottom (level N−1):

$$F_{lowest\_clock} = (F_{system}/M) * (K_0 * K_1 * K_2 \ldots * K_{N-1})^{-1} = (F_{system}/L) \quad (2)$$

where $F_{system}$ is the highest total throughput or operating frequency of the entire interleaving system.

As in Eq. 1, $K_i$ is referred to as the effective clock fanout of stage i. As discussed previously, FIGS. 3A and 3B show example 2D systems with M=2 and M=4 for dual and quadrature input clock phases with L=128 interleaving sub-converters, respectively. These systems can have $K_0=8$ as the first layer of division for the M=2 system or $K_0=4$ as the first layer of division for the M=4 system. Both systems can then have $K_0=8$ as the second layer of division.

$$F_{lowest\_clock} = (F_{input}/2) * (8*8) = (F_{input}/4) * (4*8)^{-1} = F_{input}/128$$

If $K_0 \ldots K_{N-1}$ is rewritten as $K_0 = n_0/M, \ldots,$ and $K_{N-1} = L/n_{N-1}$, where $n_i$ denotes the number of output phases of layer i, Eq. 2 can be rewritten to describe the general relationship of a complete TI tree structure in terms number of clock inputs M to an N-layer system driving L final interleavers as follows:

$$F_{lowest\_clock} = (F_{system}/M) * (n_0/M * n_1/n_0 * n_2/n_1 \ldots * L/n_{N-1})^{-1} = (F_{system}/L) \quad (3)$$

Hierarchical Retiming Design:

In a physical system, there exist latency and mismatches in latency across all physical elements that do not match one another. To either minimize or maintain the same latencies, a retiming step after clock division is crucial. To retime the clock signals at each level, several methods can be employed, including one-to-one, fine-grain propagation, and barrel shifting propagation, and the like and combinations thereof.

Figure 4A:
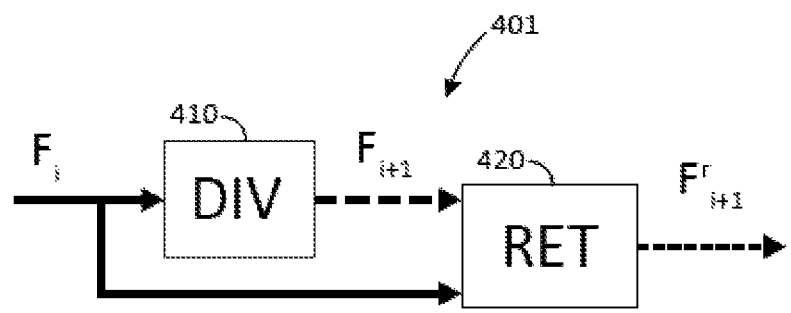
FIG. 4A is a simplified block diagram illustrating a one-to-one clock divider device according to an example of the present invention.
Figure 4B:
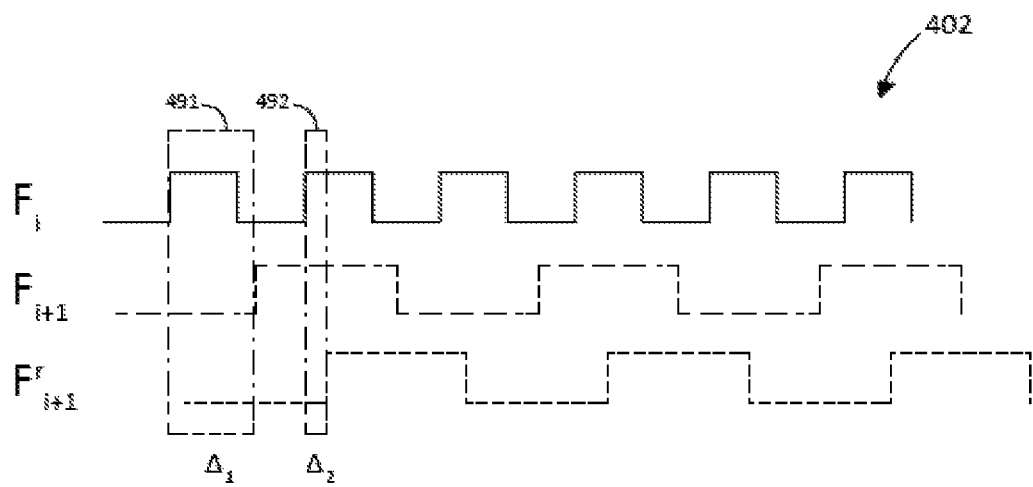
FIG. 4B is a simplified timing diagram illustrating the one-to-one clock divider device according to the example of the present invention shown in FIG. 4A.

One-to-One:

In a one-to-one retiming method, each divider output is retimed by its own input clock to align the lower clock speed edge to the higher input ones, as depicted in FIGS. 4A and 4B. FIG. 4A is a simplified block diagram illustrating a one-to-one clock divider device 401 according to an example of the present invention (i.e., one-to-one division with retiming strategy). As shown, device 401 includes a divider 410 and a retimer 420. The divider 410 receives an input clock signal denoted by $F_i$ and produces a divided output clock signal denoted $F_{i+1}$. Receiving both the input $F_i$ and the output $F_{i+1}$, the retimer 420 retimes the lower clock speed edge of output $F_{i+1}$ to the higher clock speed edge of input $F_i$. As a result, the retimer 420 produces a retimed divided clock output denoted by $F^r_{i+1}$. In general, this retiming strategy requires $H = n_0 + n_1 + \ldots + L$ dividers and retimers for all N layers (e.g., layer 1 requires $n_1$ dividers and $n_1$ retimers). Further details are shown in FIG. 4B.

FIG. 4B is a simplified timing diagram illustrating the one-to-one clock divider device 401 according to the example of the present invention shown in FIG. 4A. Timing diagram 402 shows the clock signals for $F_i$, $F_{i+1}$ and $F^r_{i+1}$. As shown, after the divider 410 receives the input clock signal $F_i$, it produces the divided clock signal $F_{i+1}$ at a lower clock speed (shown by the increased length of clock cycles). The divided clock signal $F_{i+1}$ is produced after a variable divider delay ($\Delta_1$) shown by dotted region 491. At this stage, there is generally an unpredictable mismatch between the lower clock speed edge of $F_{i+1}$ and the higher clock speed edge of $F_i$. Following the retimer 420, the divided signal $F_{i+1}$ is retimed by the signal $F_i$ and the retimed signal $F^r_{i+1}$ is produced after a retimer delay ($\Delta_2$) shown by dotted region 492. At this stage, the lower clock speed edge of $F^r_{i+1}$ is aligned much more predictably and closely to the higher clock speed edge of where $\Delta_2 \ll \Delta_1$.

As an application example, a low-power image recognition system with N sensors spanning a wide spatial area that only trigger when there is an external stimulus should have a separate divider and each sensor. Typically, only a subset of all image sensors is triggered by an external localized $F_i$, thus such separation will to conserve power while allowing fine-grain image updates. Furthermore, since such sensors typically interface with a backend electronic system, retiming is thus still required to synchronize its outputs to that interface. Those of ordinary skill in the art will recognize other variations, modifications, and alternatives to the applications of one-to-one retiming strategies used in clock divider systems.

Figure 5A:
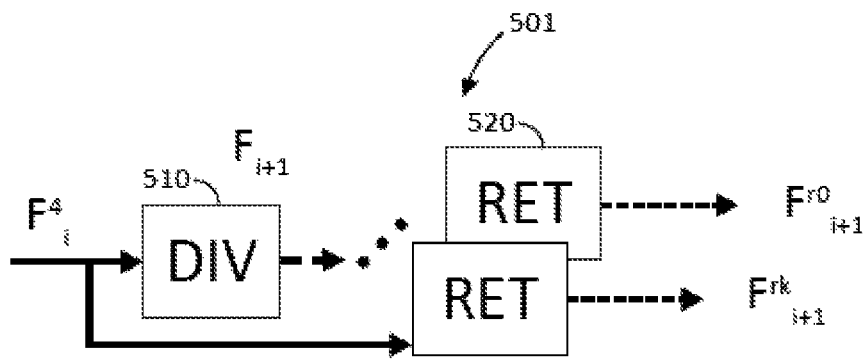
FIG. 5A is a simplified block diagram illustrating a fine-grain propagation clock divider device according to an example of the present invention.
Figure 5B:
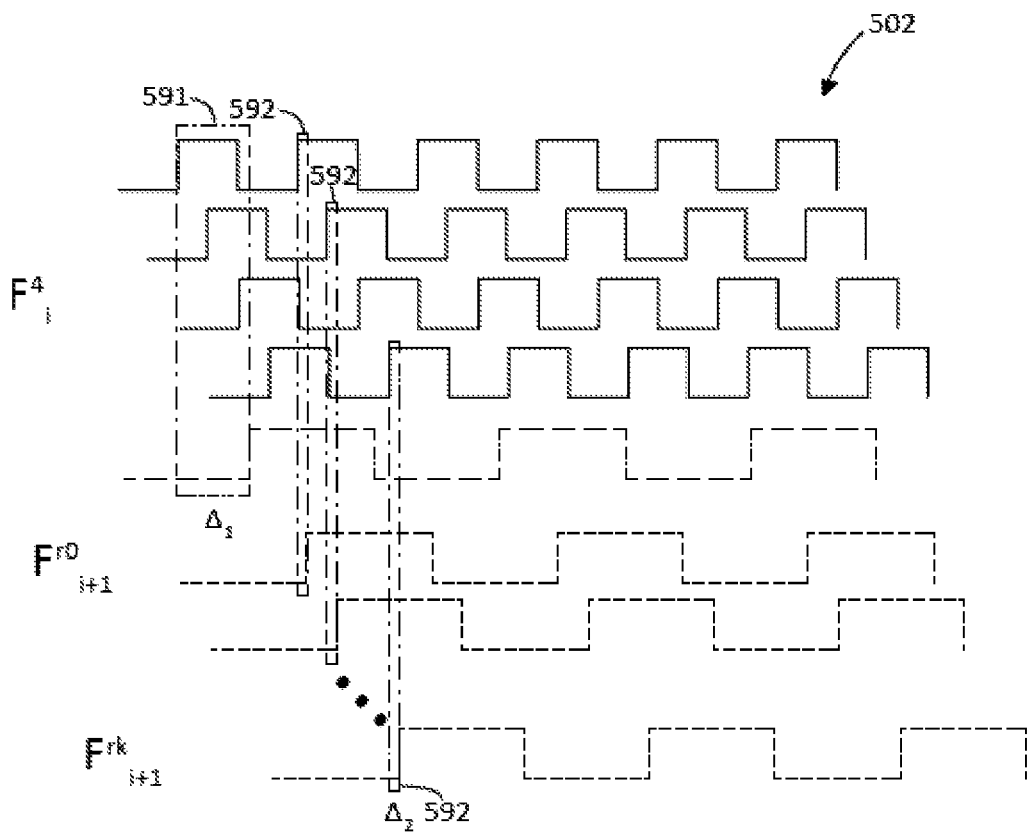
FIG. 5B is a simplified timing diagram illustrating the fine-grain clock divider device according to the example of the present invention shown in FIG. 5A.

Fine-Grain Propagation:

In a fine-grain propagation (a.k.a. fine-grain stepping) method, one divider output is retimed by all of the previous stage input clocks to generate fine grain clocks at lower speed, as in FIGS. 5A and 5B. FIG. 5A is a simplified block diagram illustrating a fine-grain propagation clock divider device 501 according to an example of the present invention (i.e., one divider+N fine-grain propagation to produce N output clocks). As shown, device 501 receives an input clock signal having a plurality of input clock phases ($F^p_i$) and includes a divider 510 and a plurality of retimers 520. The divider 510 receives one of the plurality of input clock phases and produces a divided output clock phase, denoted by $F_{i+1}$. In this case, the input clock signal has four input clock phases, denoted by $F^4_i$. Receiving both the output $F_{i+1}$ and one of the plurality of input clock phases $F^4_i$, each retimer 520 retimes the lower clock speed edge of output $F_{i+1}$ to the higher clock speed edge of one input clock phase from input $F^4_i$. As a result, each of the retimers 520 produces a retimed divided clock output denoted by $F^{r,n}_{i+1}$, where n is the retimer position in the plurality of retimers 520. In the example shown in FIG. 5A, there are H retimers resulting in the retimed divided clock outputs ranging from $F^{r,n}{}_{i+1}$ to $F^{r,H-1}{}_{i+1}$. In general, this retiming strategy requires H retimers but only P dividers (1<P<<H), and the FO is of the divider is P-to-H (e.g., layer 1 requires 1 divider and $n_1$ retimers). Further details are shown in FIG. 5B.

FIG. 5B is a simplified timing diagram illustrating the fine-grain clock divider device 501 according to the example of the present invention shown in FIG. 5A. Timing diagram 502 shows the clock signals for $F^4{}_i$, $F_{i+1}$ and $F^{r,n}{}_{i+1}$ to $F^{r,H-1}{}_{i+1}$. As shown, after the divider 510 receives the input clock signal $F^4{}_i$, it produces the divided clock signal $F_{i+1}$ (based on the first of the four input clock phases $F^4{}_i$ in this case) at a lower clock speed (shown by the increased length of clock cycles). The divided clock signal $F_{i+1}$ is produced after a divider delay ($\Delta_1$) shown by dotted region 591. At this stage, there is a mismatch between the lower clock speed edge of $F_{i+1}$ and the higher clock speed edge of the first input clock phase of $F^4{}_i$. Following the plurality of retimers 520, the divided signal $F_{i+1}$ is retimed by the different phases of input signal $F^4{}_i$ and the resulting signals $F^{r,0}{}_{i+1}$ to $F^{r,H-1}{}_{i+1}$ are produced after a retimer delay ($\Delta_2$) shown by dotted regions 592. At this stage, the lower clock speed edges of $F^{r,0}{}_{i+1}$ to $F^{r,H-1}{}_{i+1}$ are aligned much more predictably and closely to the corresponding higher clock speed edges of the $F^4{}_i$, where $\Delta_2 << \Delta_1$.

As an application example, a 16-TI converter system (similar to device 302 shown in FIG. 3B) can use a single Div-4 to generate a single divided-down-by-16 output clock and subsequently use the 4 high-speed input clocks to retime this output to generate the needed 16-divided clocks with the lowest latency possible. Those of ordinary skill in the art will recognize other variations, modifications, and alternatives to the applications of fine-grain propagation retiming strategies used in clock divider systems.

Figure 6A:
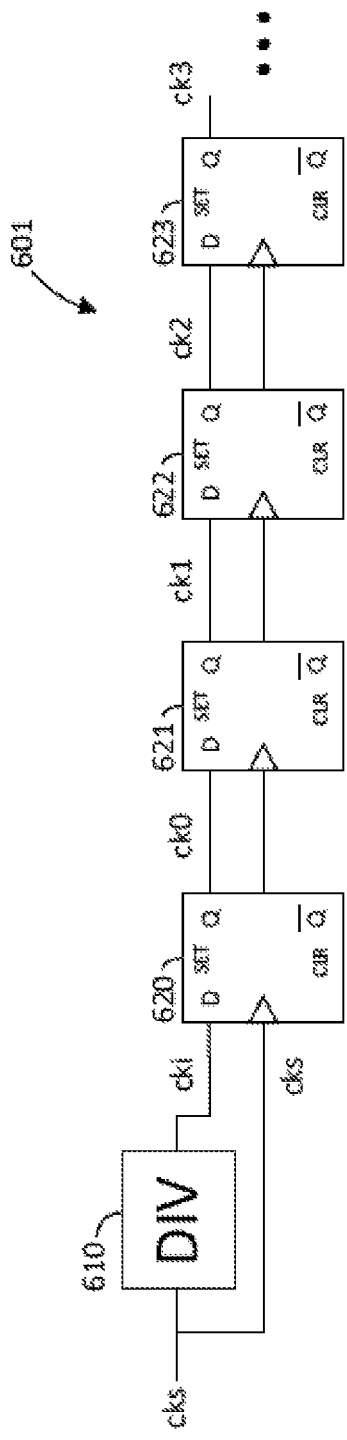
FIG. 6A is a simplified block diagram illustrating a barrel shifting propagation clock divider device according to an example of the present invention.
Figure 6B:
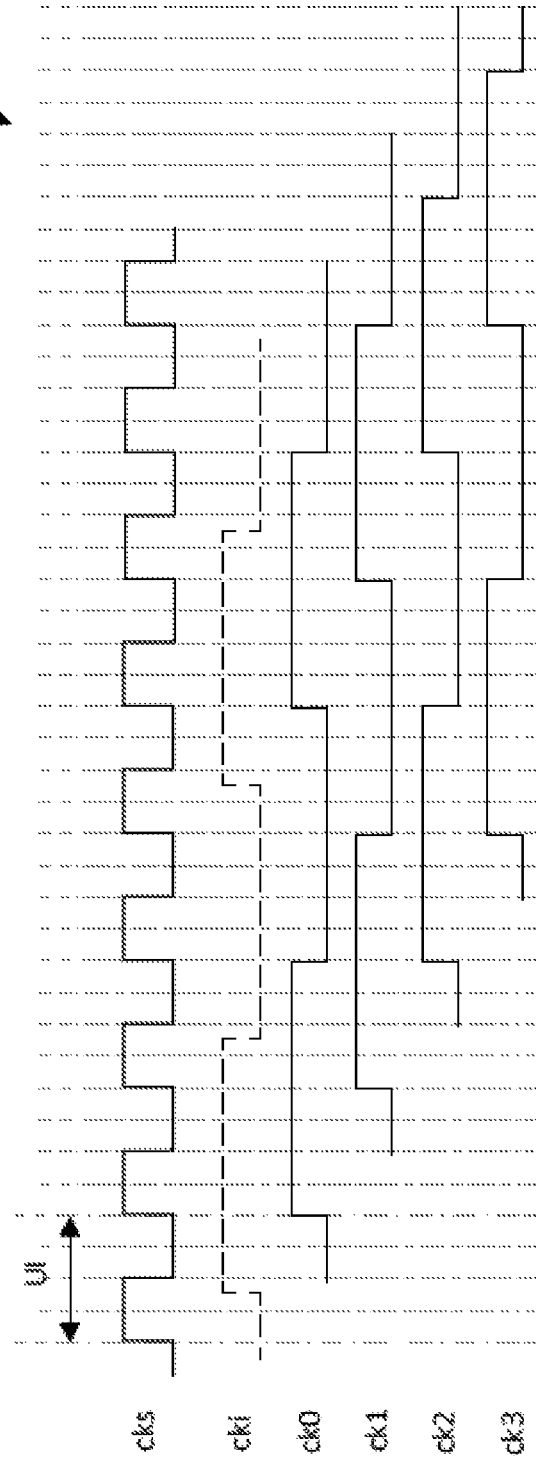
FIG. 6B is a simplified timing diagram illustrating the barrel shifting propagation clock divider device according to the example of the present invention shown in FIG. 6A.

Barrel Shifting Propagation:

In a barrel shifting (a.k.a. zero phase stepping) propagation method, the output of one divider is retimed by its input clock, and that output is propagated to the next divider to be retimed in a temporal fashion, as in FIGS. 6A and 6B. FIG. 6A is a simplified block diagram illustrating a barrel shifting propagation clock divider device 601 according to an example of the present invention (i.e., barrel shifting with pulse propagation and single retiming clock). As shown, device 601 receives an input clock signal, denoted by cks, and includes a divider 610 and a plurality of propagating retimers 620-623, shown here as D-type flip flops configured in series.

In an example, the divider 610 receives the input signal cks and produces a divided output clock signal, denoted by cki. Receiving both the input cks and the output cki, the retimer 620 retimes the lower clock speed edge of cki to the higher clock speed edge of cks, producing a retimed divided clock signal, denoted as ck0. The retimer 621 receives the input cks and the output ck0, and then retimes the lower clock speed edge of ck0 to the higher clock speed edge of cks, producing another retimed divided clock signal, denoted by ck1. Similarly, the retimer 622 retimes output ck1 to cks to produce a retimed divided clock signal (denoted by ck2) and the retimer 623 retimes output ck2 to cks to produce a retimed divided clock signal (denoted by ck3). In this case, the device 601 produces four retimed divided clock signals with different phases, but additional retimers can be added to produce additional phases. In general, this method requires 1 divider and is similar to the fine-grain propagation method above except that all high-speed phases reduce to a single clock. Further details are shown in FIG. 6B.

FIG. 6B is a simplified timing diagram illustrating the barrel shifting propagation clock divider device 601 according to the example of the present invention shown in FIG. 6A. Timing diagram 602 shows the clock signals for cks, cki and ck0 to ck3. As shown, after the divider 610 receives the input clock signal cks, it produces the divided clock signal cki at a lower clock speed (shown by the increased length of clock cycles). At this stage, there is a mismatch between the lower clock speed edge of the output cki and the higher clock speed edge of the input cks. Then, the divided signal cki is retimed by each of the propagation retimers to the input cks in a temporal fashion, which produces the retimed divided output signals ck0 to ck3. The resulting output signals ck0 to ck3 are time-shifted versions of cki that are aligned to consecutive rising edges of cks. Although not explicitly shown, there can be a similar delay ($\Delta_2$) with the retimer outputs as discussed in the previous methods.

In discussing the methods above, those of ordinary skill in the art will recognize variations, modifications, and alternatives to the device architectures shown and number of dividers and retimers used depending on desired FO and other design choices. These methods can also be combined together in various configurations depending upon the specific application. An example of an application using the three methods discussed previously is shown in FIG. 7.

Figure 7:
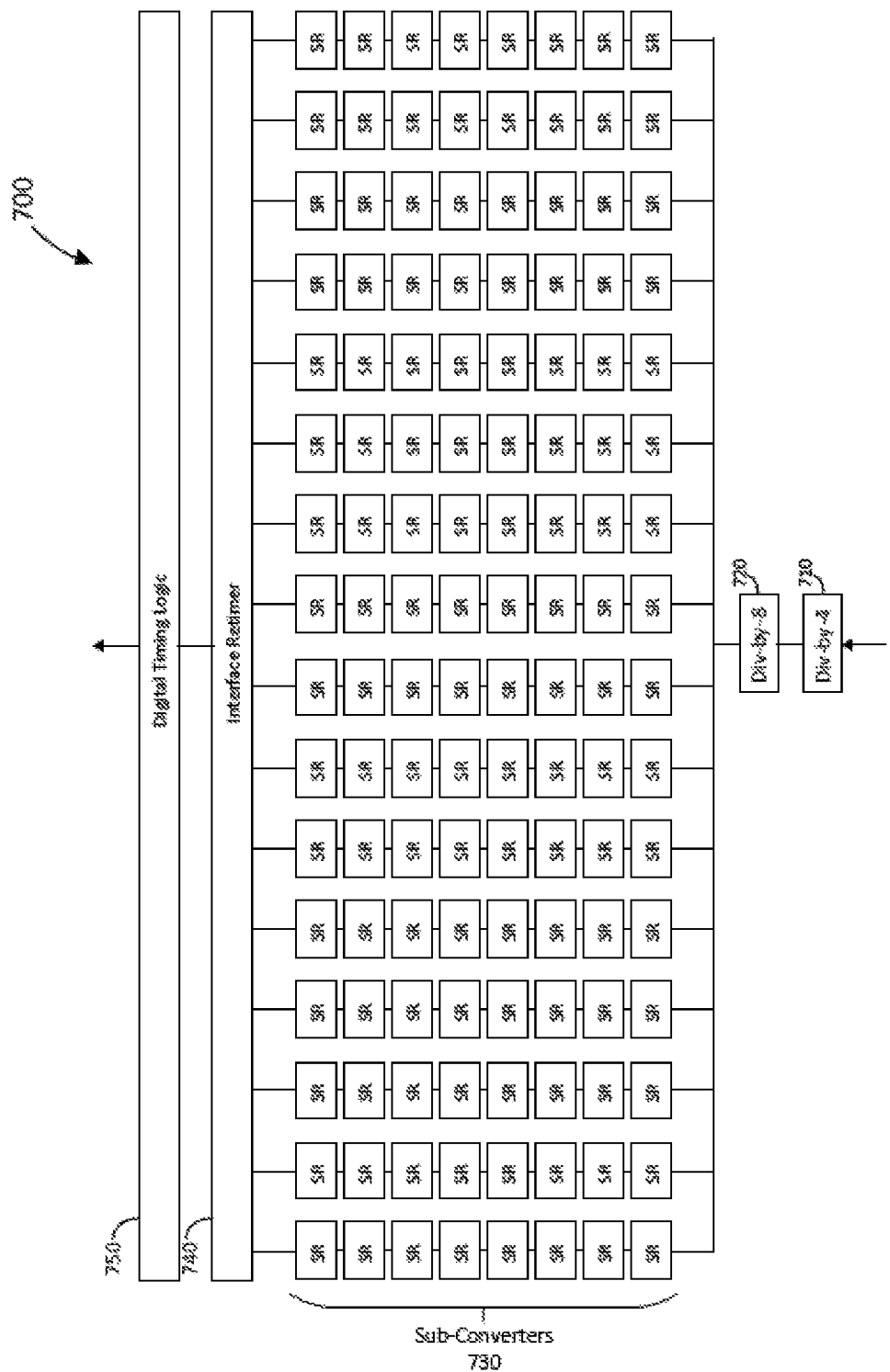
FIG. 7 is a simplified block diagram illustrating a two-layer TI system according to an example of the present invention.

FIG. 7 is a simplified block diagram illustrating a two-layer TI system 700 according to an example of the present invention. Suppose a TI network requirement is M=4 input phases and L=128 final interleavers as analog successive registers (SR), a possible system design can be devised as an N=2 layer network with a structure of 4-4-8. As shown, system 700 comprises a divide-by-4 (Div-by-4) divider 710, a divide-by-8 (Div-by-8) divider 720, a plurality of sub-converters 730, and an interface retimer block 740. In this case, the Div-by-4 and Div-by-8 dividers 710, 720 produce all required divided clock frequencies to the 128 sub-converters 730. In an example, the first layer pair (4-4) is synchronized by the Div-by-4 divider 710 using a fine-grain retimer, which uses the fine-grain propagation technique to produce 16 fine-grain clock frequencies. The outputs from the fine-grain retimers of the Div-by-4 divider 710 are sent to the Div-by-8 divider 720. The second layer pair (4-8) is synchronized by the Div-by-8 divider 720 using barrel shifting retimers, which uses the barrel shifting propagation technique to produce barrel-shifted clock frequencies. These barrel shifting retimers 750 receive the fine-grain clocks as the source clocks (i.e., "cks" as shown in FIGS. 6A and 6B). The resulting barrel-shifted clocks supplement the 16 fine-grain clocks to produce the required 128 output clocks. Finally, the output of this network is synchronized by the interface retimer device 740, which can include a plurality of interface retimers coupled the sub-converters 730. The synchronized clock frequencies can then be combined into a single data packet at a digital timing logic (DTL) device 750 (or plurality of DTL blocks) coupled to the interface retimer device 740 before going to the digital domain. Those of ordinary skill in the art will recognize other variations, modifications, and alternatives.

Figure 8A:
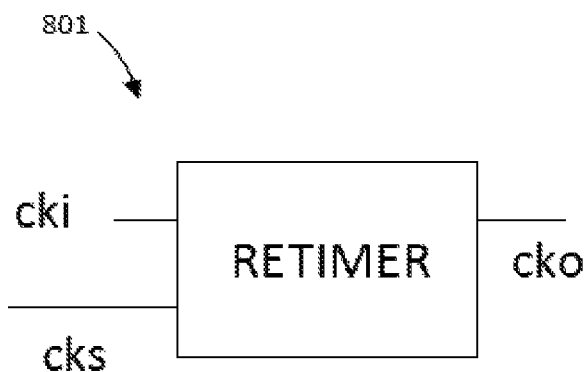
FIG. 8A is a simplified block diagram illustrating a conventional retimer.
Figure 8B:
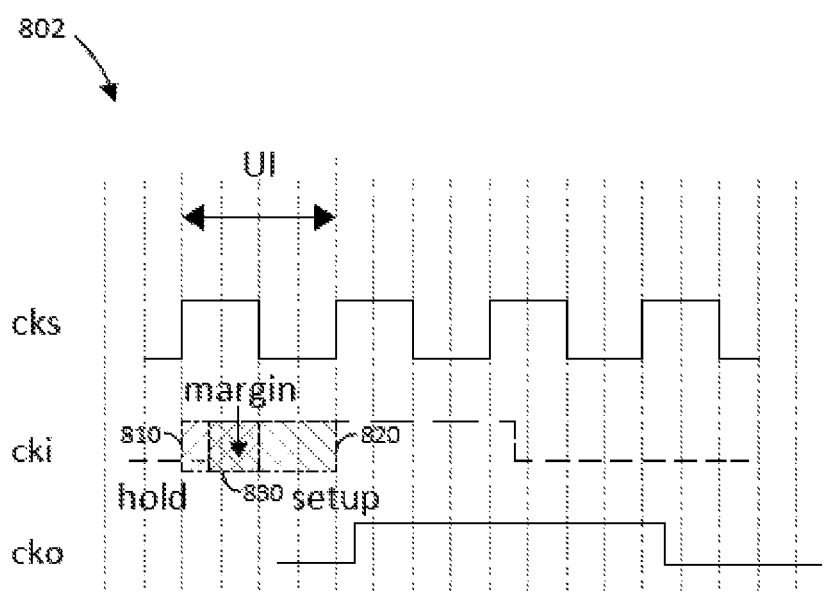
FIG. 8B is a simplified timing diagram illustrating an example operation of the retimer shown in FIG. 8A.

Negative p Phase Stepping for Optimal Re-Timing Margin:

FIG. 8A is a simplified block diagram illustrating a conventional retimer 801. As shown, retimer 801 receives an input clock signal (cki) and a source clock signal (cks), and then retimes the cki signal according to the cks signal to produce the output clock signal (cko). FIG. 8B is a simplified timing diagram 802 illustrating an example operation of the retimer shown in FIG. 8A. As shown, timing diagram 802 includes the cks, cki and cko signals. Due to the speed limit of clocking retimers, minimum hold and setup times are required to ensure proper operation. For the cki signal, the hold and setup times are shown by regions 810 and 820, respectively. Any extra time larger than the minimum required setup and hold times are considered margin, which is shown by region 830. For optimal robustness across all variations (including but not limited to temperature, process, environments, etc.) the maximum timing margin is always desirable for any clocking system. Conversely, the smallest unit interval (UI) at which the retimer can safely operate is the sum of its setup and hold times plus an allocated design margin. The UI sets the upper limit of how fast the system can run.

Figure 9:
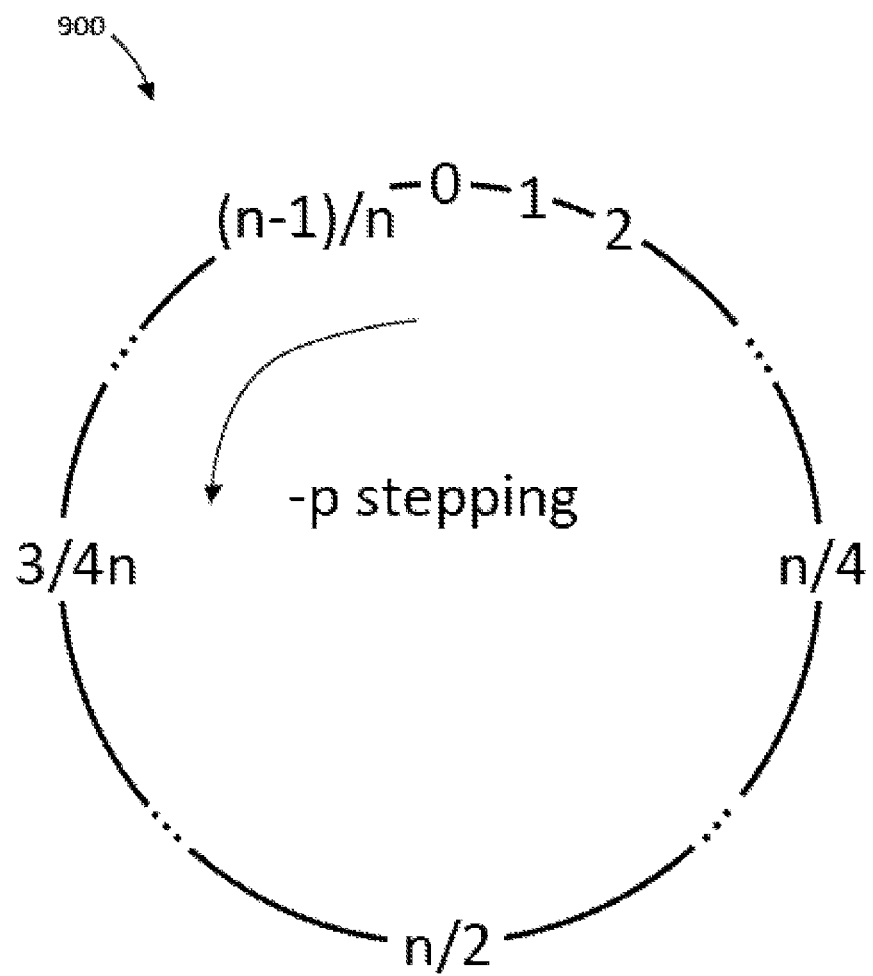
FIG. 9 is a simplified diagram illustrating a phase relationship circle for equidistant time interleaving instants according to an example of the present invention.

In an example, consider the clock network between layer i and i+1 within a larger N-layer TI system. To minimize the number of dividers for power saving, the fine-grain stepping method can be applied on the $n_i$ input clocks to generate $n_{i+1}$ lower frequency output clocks. Since the $n_i$ input clock phases form a 360 degrees phase complete circle, the most efficient way to retime this network is through negative p phase walking (a.k.a. −p stepping), shown in FIG. 9. FIG. 9 is a simplified diagram illustrating a phase relationship circle 900 for equidistant time interleaving instants according to an example of the present invention. As shown, phase circle 900 includes $n_i$ input clock phases organized from zero to (n−1)/n in a clockwise manner. The −p stepping is shown by the arrow in the counter-clockwise direction.

Retiming using a phase that is too nearby a current phase position runs the risk of insufficient hold and/or setup times. Furthermore, in the context of integrated circuits, the setup time typically dominates design constraints and the hold time is typically zero or negative. Thus, considering a generalized N phase division system generating kN output phases, the optimal and most symmetric loading retiming order is in step of N−1 or, equivalently, −1. For example:

For 4 input phases→Div-2→8 output phases,
  Retiming order: 0, 3, 6, 1, 4, 7, 2, 5, 0, . . .
For 4 input phases→Div-4→16 output phases,
  Retiming order: 0, 3, 6, 9, 12, 15, 2, 5, 8, 11, 14, 1, 4, 7, 10, 13, 0, . . .
For 4 input phases→Div-8→32 output phases,
  Retiming order: 0, 3, 6, 9, . . . , 27, 30, 1, . . . , 28, 31, 2, . . . , 26, 29, 0, . . .
For 8 input phases→Div-2—16 output phases,
  Retiming order: 0, 7, 14, 5, 12, 3, 10, 1, 8, 15, 6, 13, 4, 11, 2, 9, 0, . . .

Figure 10:
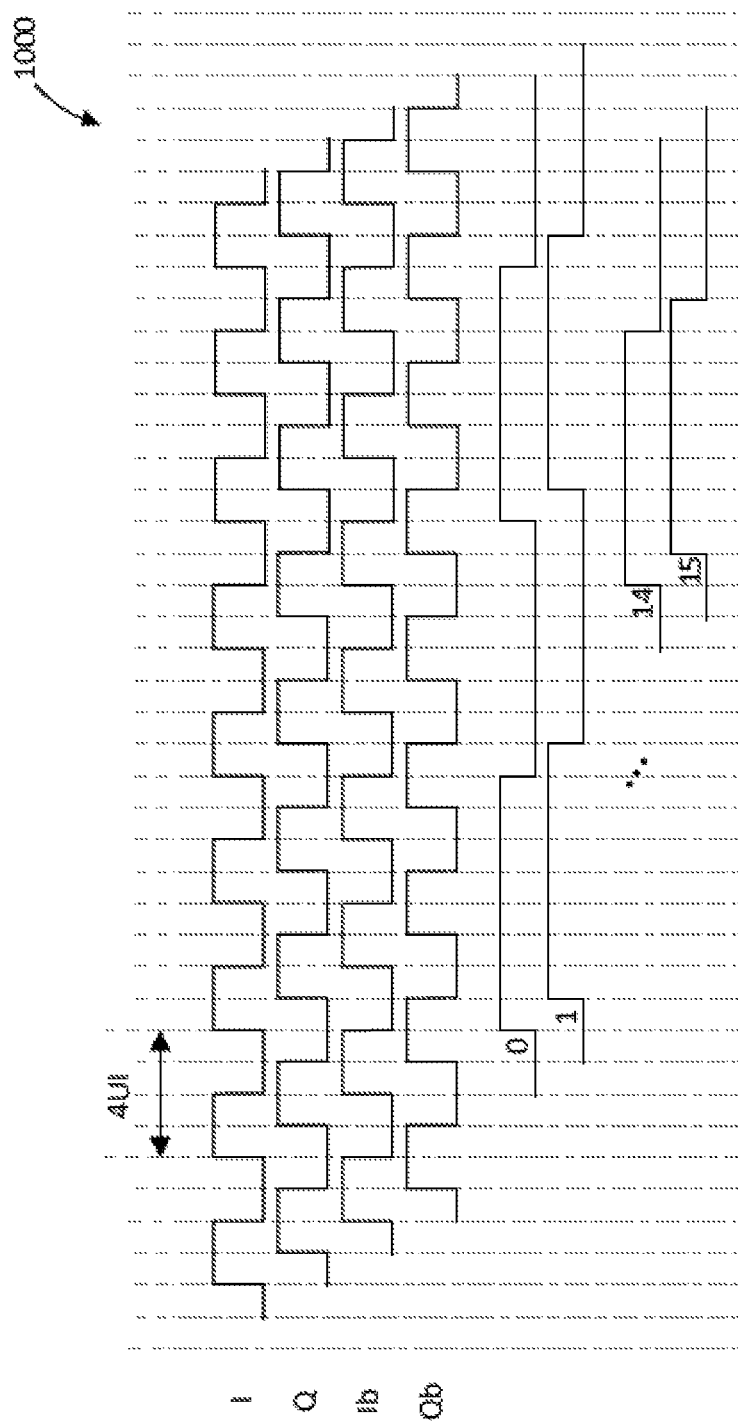
FIGS. 10 and 11 are simplified timing diagrams illustrating example clock generation strategies for a 4-4 interleaving layer according to examples of the present invention.
Figure 11:
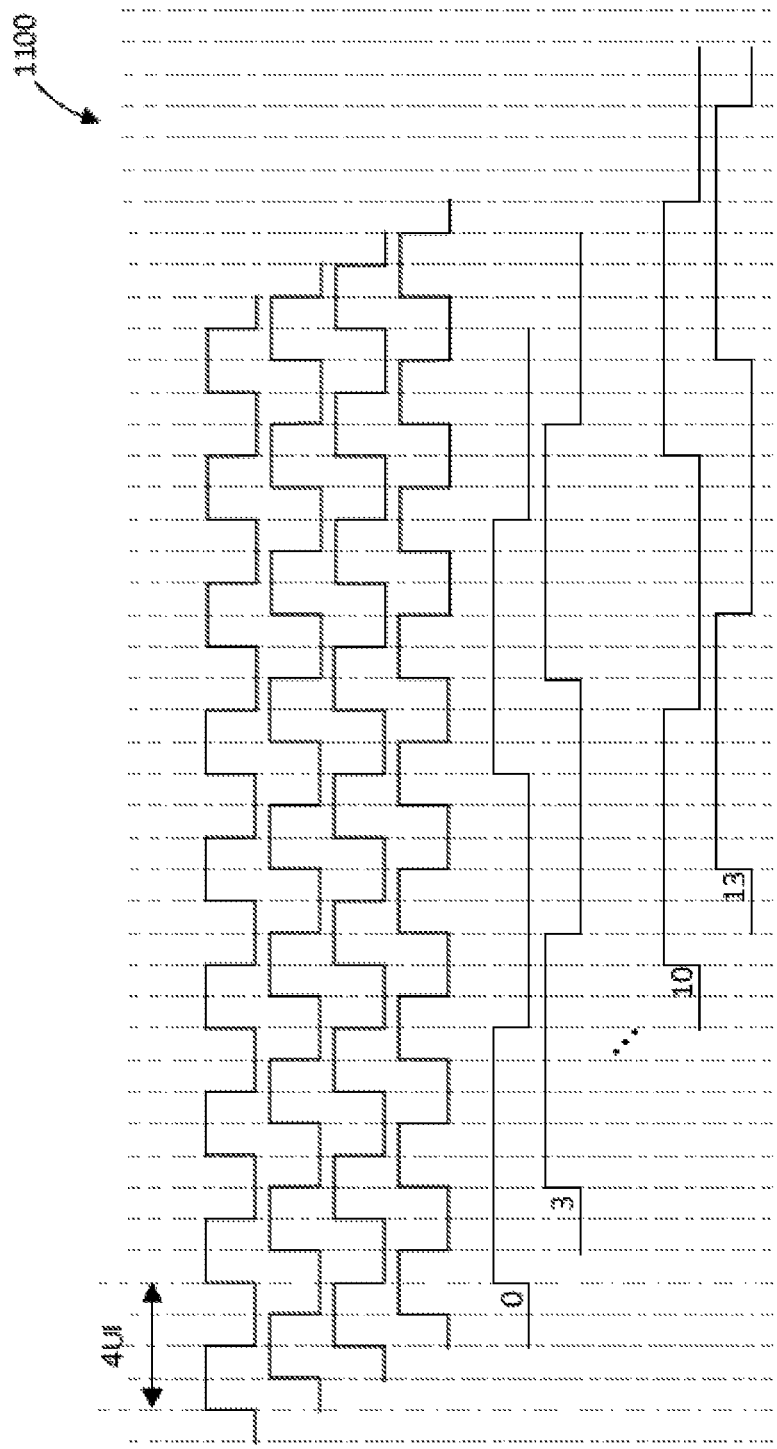

To better visualize this concept, consider the example shown previously in FIG. 7 where the input clocks consist of four phases and the objective is to generate 16 output phases for the first interleaving layer. FIGS. 10 and 11 are simplified timing diagrams illustrating example clock generation strategies for a 4-4 interleaving layer according to examples of the present invention. As shown, timing diagrams 1000 and 1100 both show the four input phases denoted as signals I, Q, $I_b$, and $Q_b$.

Generating all 16 output phases in the natural order would be the simplest approach. As shown in FIG. 10 below the input phases (denoted as I, Q, $I_b$, and $Q_b$), the 16 output phases (denoted as signals 0-15) are generated in sequence at one UI apart (i.e., natural order). However, such a timing strategy would place an enormous constraint of speed on the retimers, since each must now settle within one UI of the system.

To maximize our operating speed, the −p stepping strategy (as shown in FIG. 9) can be applied with p=1, giving each retime 3 UI to settle, which greatly relaxes the speed requirements and subsequently minimizes power consumption. As shown in FIG. 11 below the input phases (denoted as I, Q, Ib, and Qb), the 16 output phases (denoted as signals 0-15) are generated in sequence at three UI apart (i.e., −p stepping with p=1).

According to the present invention, this −p stepping technique can be generalized to any TI system with Minput phases and L output phases as follows:

Minput phases→div-L/M→L output phases: optimal retiming step=−p

It can be proven by induction that the above phase stepping always completes the phase circle for any integer value of M and L with the proper choice of p. For even values of M, the best p for maximum margin is 1. However, depending on application, other odd values of p may be preferred. For odd values of M, the best p for maximum margin is the smallest positive integer value such that mod(L,M−p)=odd, allowing the completion the phase circle in FIG. 9. For example, stepping techniques of "−2" and "−1" for cases of odd M (M=5) values are shown, respectively, as follows:

input M=5→div-2→output L=10 (p=2): 0, 3, 6, 9, 2, 5, 8, 1, 4, 7, 0, . . .
input M=5→div-3→output L=15 (p=1): 0, 4, 8, 12, 1, 5, 9, 13, 2, 6, 10, 14, 3, 7, 11, 0, . . .

Figure 12A:
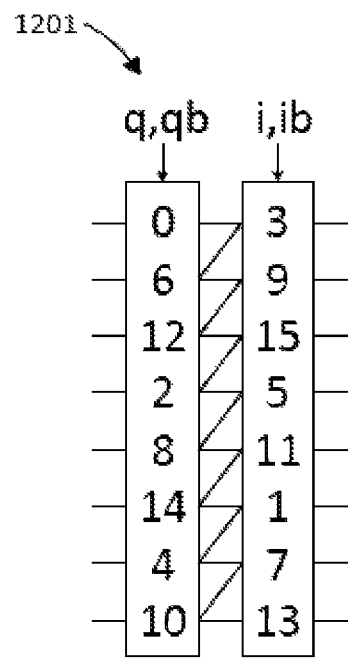
FIG. 12A is a simplified stepping diagram illustrating an N−1 phase stepping method according to an example of the present invention.

FIG. 12A is a simplified diagram 1201 illustrating a retimer configuration for a TI system using an M−1 phase stepping method according to an example of the present invention. As shown, retimer configuration 1201 illustrates the positional benefits of M−1 phase stepping (i.e., −1 stepping) for a TI system in which M=4 and L=16, similar to the example shown in FIG. 11. There are several reasons why the above stepping algorithm is the optimal method. First, this method allocates most of the available time within a clock cycle setup time. Second, this method ensures equal and distributed loading in layout for the M high-speed input clocks (e.g., i, ib, q, and qb in FIG. 12A have equal routing length with distributed taps along their lengths). Third, this stepping method allows for splitting up even and odd phases in the most compact fashion, which is an aspect most often desired in nm integrated circuits. Fourth, this also ensures that the connections between retimers are the shortest, least congested, and of the lowest parasitics.

Figure 12B:
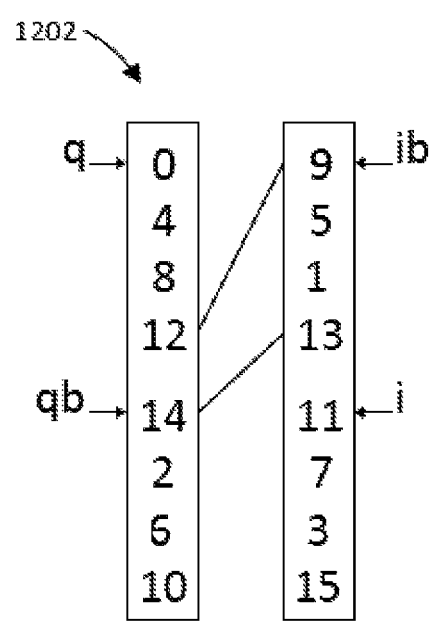
FIG. 12B is a simplified stepping diagram illustrating an alternating stepping method according to an example of the present invention.

FIG. 12B is a simplified stepping diagram 1202 illustrating a retimer configuration for a TI system as an alternating stepping method according to an example of the present invention. Depending on the application, stepping of alternating 0 and −p (i.e., M and M−p) can also be a near optimal solution. However, the alternating method loses symmetry of input clock loading, and the difficulty in timing closure increases during switches from odd phases to even phases. As shown, retiming configuration 1202 is an example of a system of M=4 and L=16, which has a stepping order as follows:

input M=4→output L=16 (alternating p=1 and 0): 0, 4, 8, 12, 15, 3, 7, 11, 14, 2, 6, 10, 13, 1, 5, 9

In this fashion, only the transition pairs (in bold) are −1 stepping (p=1), while the other pairs are 0 stepping (p=0). In principle, this method can be more energy efficient since the 0-stepping pairs can run slower if routing mismatch is not a concern. However, this method breaks the natural order of the sequence, and thus layout arrangement is more difficult since this method requires longer connections between subsets of the −1 transition pairs. This leads to the longest transition pairs becoming the weakest links in the entire chain, which causes the timing margin to be less optimal than the previous scenario and subsequently can demand higher energy to achieve a similar timing margin (as shown in FIG. 12B). This is particularly true for sub nm process where between-cell routing is the bottleneck of high-speed designs.

Forward Layer-to-Layer Synchronization:

Using the techniques described above, the present invention provides an optimal architecture to synchronize any layer i+1 of an N-layer TI structure (M input clock phases, L output phases/interleavers), wherein the particular layer i+1 has $N_i$ input clock phases and $N_{i+1}$ output clock phases (Note: divider ratio of layer i+1 is $K_i=N_{i+1}/N_i$; $N_0=M$; $N_{N-1}=L$). According to an example, the design strategy is as follows:

1. Send $N_i$ input clocks (outputted from the previous layer i) to all $N_i$ interleaving branches between layer i to i+1, but only send 1 divided clock to only one of the interleaved branches (designated as the "first" clock; see "x" at column 0, row 0, in FIG. 13);
2. Retime the "first" clock using fine-grain propagation with the $N_i$ clocks according to the −p phase stepping strategy (lateral retiming strategy) to produce $N_i$ fine grain clocks (see column values for row 0 of FIG. 13);
3. Retime the $N_i$ fine grain clocks using the barrel shifter technique (vertical retiming strategy) to produce Kc clocks for each of the $N_i$ fine grain clocks for a total of $N_i \times K_i = N_{i+1}$ output clock phases (see rows 0 to $K_i$−1 of FIG. 13).

The above sequence of steps is used to operate an N-layer TI system to synchronize one of its layers (i.e., layer n+1) according to an embodiment of the present invention. Depending upon the embodiment, one or more of these steps can be combined, or removed, or other steps may be added without departing from the scope of the claims herein. One of ordinary skill in the art would recognize other variations, modifications, and alternatives.

In an example, the present invention provides a multi-layer TI system. This system includes a plurality of TI layers configured to receive a plurality of input clock signals and to output a plurality of output clock signals, each of which can be configured to drive a subsequent devices (e.g., sub-converters and the like). The plurality of TI layers comprises at least a first layer including a fine-grain propagation device and a second layer including a barrel-shifting propagation device.

The fine-grain propagation device includes a divider and a first plurality of retimers. As described in reference to FIG. 5A, the divider receives the plurality of input signals and produces a plurality of divided clock signals, which are each retimed by the first plurality of retimers using the plurality of input signals to produce a plurality of fine-grain clock signals characterized by −p phase stepping (as described in reference to FIG. 9).

The barrel shifting propagation device includes a plurality of propagation retimer chains, each of the propagation retimer chains including a plurality of propagation retimers coupled in series. Each of the plurality of propagation retimer chains is configured to receive one of the plurality of fine-grain clock signals and to produce a plurality of barrel-shifted clock signals (as described in reference to FIG. 6A) from the particular fine-grain clock signal. The plurality of output clock signals includes the plurality of fine-grain clock signals and all pluralities of barrel-shifted clock signals derived from each of the plurality of fine-grain clock signals.

In an example, the multi-layer TI system can include additional fine-grain layers (i.e., additional clocks retimed using fine-grain propagation) and the barrel shifter technique can be used on the additional fine-grain clocks to produce additional barrel-shifted clocks. These additional fine-grain layers can be represented collectively as a multi-dimensional fine-grain clocking structure, and the resulting fine-grain clocks be barrel-shifted to generate further "dimensions" of clock frequencies in a multi-dimensional TI system. The barrel-shifting propagation device can then be used to produce additional barrel-shifted clock signals from these additional fine-grain clocks.

FIG. 13A is a simplified table 1301 representing a general strategy for layer-to-layer synchronization in a TI system according to an example of the present invention. As shown, table 1301 is organized by row and column with the starting cell being the origin cell c[0, 0]=x at the bottom right corner. Here, the values in each of the other cells are derived from the value of the origin cell $c_{0,0}$ and column index values of $i_0, \ldots, i_{Ni-1}$. As described previously, the first divided clock in $c_{0,0}$ is retimed by fine-grain propagation to produce the clock phases in the rest of row 0. Each of the clock phases of row 0 are retimed by the barrel shifter technique to produce the clock phases for the remaining cells of rows 0 to $K_i$−1.

Figure 14:
FIG. 14 is simplified table illustrating a lateral stepping of −1 synchronization method for a TI system according to an example of the present invention.
Figure 15A:
FIG. 15A is a simplified pair of tables illustrating a lateral stepping of −2 synchronization method for a TI system according to an example of the present invention.
Figure 15B:
FIG. 15B is a simplified tables illustrating a lateral stepping of alternating −4 and −2 synchronization method for a TI system according to an example of the present invention.

In other examples, the starting cell can be a cell other than the origin cell. Since the time interleaved systems are causal, once the process begins with a cell and column (e.g., $c_{0,0}$=x), negative phase stepping, and barrel shifting shall produce all samples that must occur at later points in time. This has implications on output synchronization later. In FIGS. 14, 15A, and 15B, we apply the strategy shown in FIG. 13A to show several variational choices of an interleaving 4-to-8 layer pair. Those of ordinary skill in the art will recognize other variations, modifications, and alternatives to the representation of this general strategy.

FIG. 13B is a simplified table 1302 representing a general strategy with fixed −p phase relationship for layer-to-layer synchronization in a TI system according to an example of the present invention. This table 1302 shows a special case where the relationship between the indexes are fixed as −p phase relationship. In this case, the phase stepping is deterministic at $-p=i_1-i_0=i_2-i_1= \ldots$ . Of course, there can be variations, modifications, and alternatives.

FIG. 14 is simplified table 1400 illustrating a lateral stepping of −1 synchronization method for a TI system according to an example of the present invention. As shown, table 1400 depicts the synchronization of layer i with 16 fine-grain input clocks ($N_i$=16; $K_i$=8) and layer i+1 with 128 interleavers=128). Here, p=1 for −1 lateral stepping, and the first column is column 15 (i.e., the first divided clock provided in col 15, row 0).

FIG. 15A is a simplified pair of tables illustrating a lateral stepping of −2 synchronization method for a TI system according to an example of the present invention. As shown, table 1501 and 1502 depict the synchronization of layer i with 16 fine-grain input clocks ($N_i$=16; $K_i$=8) and layer i+1 with 128 interleavers=128) with split even (table 1501) and odd (table 1502) phases. Here, the −2 stepping is shown with the first columns being columns 14 and 15.

FIG. 15B is a simplified table illustrating a lateral stepping of alternating −4 and −2 synchronization method for a TI system according to an example of the present invention. As shown, tables 1503 and 1504 depict the synchronization of layer i with 16 fine-grain input clocks ($N_i$=16; $K_i$=8) and layer i+1 with 128 interleavers=128) also with split even (table 1501) and odd (table 1502) phases. Here, the alternating −4 and −2 stepping is shown with the first columns being columns 12 and 13.

The synchronization examples shown in FIGS. 14, 15A, and 15B illustrate the application of the generalized stepping order of FIG. 13A according to specific design choices.

These designs and interleaving partition choices are merely examples and those of ordinary skill in the art will recognize other variations, modifications, and alternatives.

Output Synchronization:

Even after the interleavers are synchronized properly in time, their outputs need to be synchronized as well. Since most electronic systems have an interface to the outside world that requires simple synchronization, the output synchronization typically involves recombining the outputs in the correct order and updated with a single clock edge. From the $N_{i+1}$ data outputs of all columns at layer i+1, the −p stepping technique can be applied to resynchronize the data in chronological order.

According to an example, the present invention provides for applying the −p stepping technique and a "staggered re-sampling" approach to resynchronize data from the K data outputs of each column at layer i+1 in chronological order to a single output clock edge.

Figure 16:
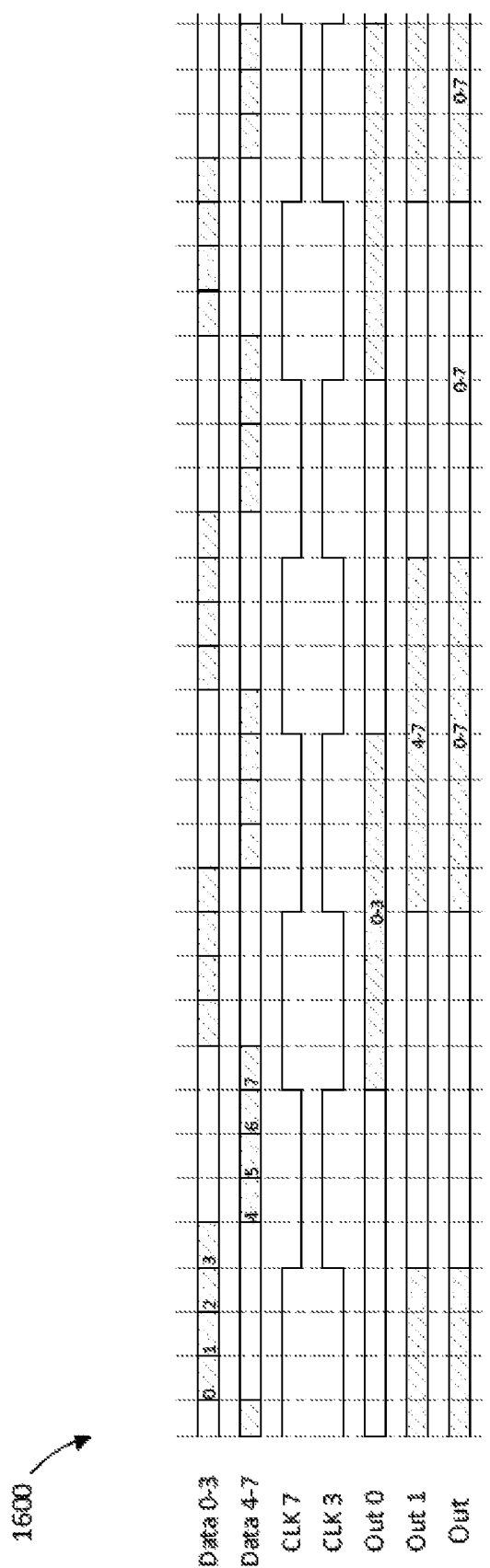
FIG. 16 is a simplified timing diagram illustrating a negative phase stepping and staggered resampling method for data synchronization in a TI system according to an example of the present invention.

FIG. 16 is a simplified timing diagram 1600 illustrating a negative phase stepping and staggered resampling method for data synchronization in a TI system according to an example of the present invention. As shown, timing diagram 1700 shows the following signals: Data 0-3, Data 4-7, CLK 7, CLK 3, Out 0, Out 1, and Out. As an example, Data 0-3 and Data 4-7 represent the outputs from column 12, rows 0-7, of FIG. 15B.

These interleavers' outputs are thus ordered in time, and the objective here is to re-sync them to a single clock edge (either the rising edge or the falling edge). In this case, row 7 of column 12 (referring to FIG. 15B) is assumed to arrive latest in time (note: the row that arrives latest in time can vary given the cyclical phase relationship). Breaking this data into two halves 0-3 and 4-7 and employing −1 stepping, the best clocks to retime them are thus CLK 7 and CLK 3, respectively. CLK 7 aligns Data 0-3 to its rising edge, producing Out 0, whereas CLK 7 aligns Data 4-7 to its rising edge, producing Out 1. Here, an additional resampling of Out 0 on CLK 3 is further needed to ultimately align the original Data 0-3 with Data 4-7 producing the final output Out, which contains ordered data 0-7 from the same column. In this case, the final Out signal thus aligns to a single clock edge CLK 3.

In an example, a generalized synchronization strategy for any layer i+1 with columns n $(0, \ldots, N_i-1)$ for the deserialization of column data to a single chosen clock edge of row k $(0, \ldots, K_i-1)$ of the column for optimal timing margin is as follows:

1. For a starting column n $(0, \ldots, N_i-1)$, pick the clock k corresponding to row $(0, \ldots, K_i-1)$, which will be used to align the column final data to. Note: which clock and whether using the rising/falling edge depends on design choice.
2. Retime all rows of the starting column using the staggered resampling technique; the early clock that samples the first half of data is determined by MOD $(k+K_i/2, K_i)$, or the inverse of clock k, and clock k samples the second half of column data.
3. Additionally retime the first half of data using clock k again to align the first and second halves to produce the final ordered column data output aligned to clock k. Based on the choice of clock k, the final data order will be the following: MOD$(k-K_i+1+N_i, N_i) \rightarrow$ MOD$(k+K_i, N_i)$. E.g. In the 4-4-8 example, this becomes MOD$(k-3+16, 16) \rightarrow$ MOD$(k+4, 16)$.
4. Repeat the above steps for all adjacent column data following the −p phase stepping technique implemented in FIG. 13 on the next values of k to ensure that all column outputs are correctly ordered in time.

The above sequence of steps is used to operate an N-layer TI system to synchronize the outputs of all columns n $(0, \ldots, N_i)$ in a layer i according to an embodiment of the present invention. These steps can be performed by interface retimers or the like and combinations thereof. Depending upon the embodiment, one or more of these steps can be combined, or removed, or other steps may be added without departing from the scope of the claims herein. One of ordinary skill in the art would recognize other variations, modifications, and alternatives.

As an illustration of the interleaving structure of FIG. 14, we start with column 15, choosing row 0 output clock as the starting point for this column (i.e., x=15 and y=0). Progressing from column 15 to 0 and following the principles outlined previously, the subsequent clock row for columns 14-0 (right-to-left) will be 7, 6, 5, 4, 3, 2, 1, 0, 7, 6, 5, 4, 3, 2, 1. Likewise for the structure in FIG. 15B, the row orders from right-to-left is 1, 2, 3, 4, 5, 6, 7, 0 (right half) and 0, 7, 6, 5, 4, 3, 2, 1 (left half).

Figure 17:
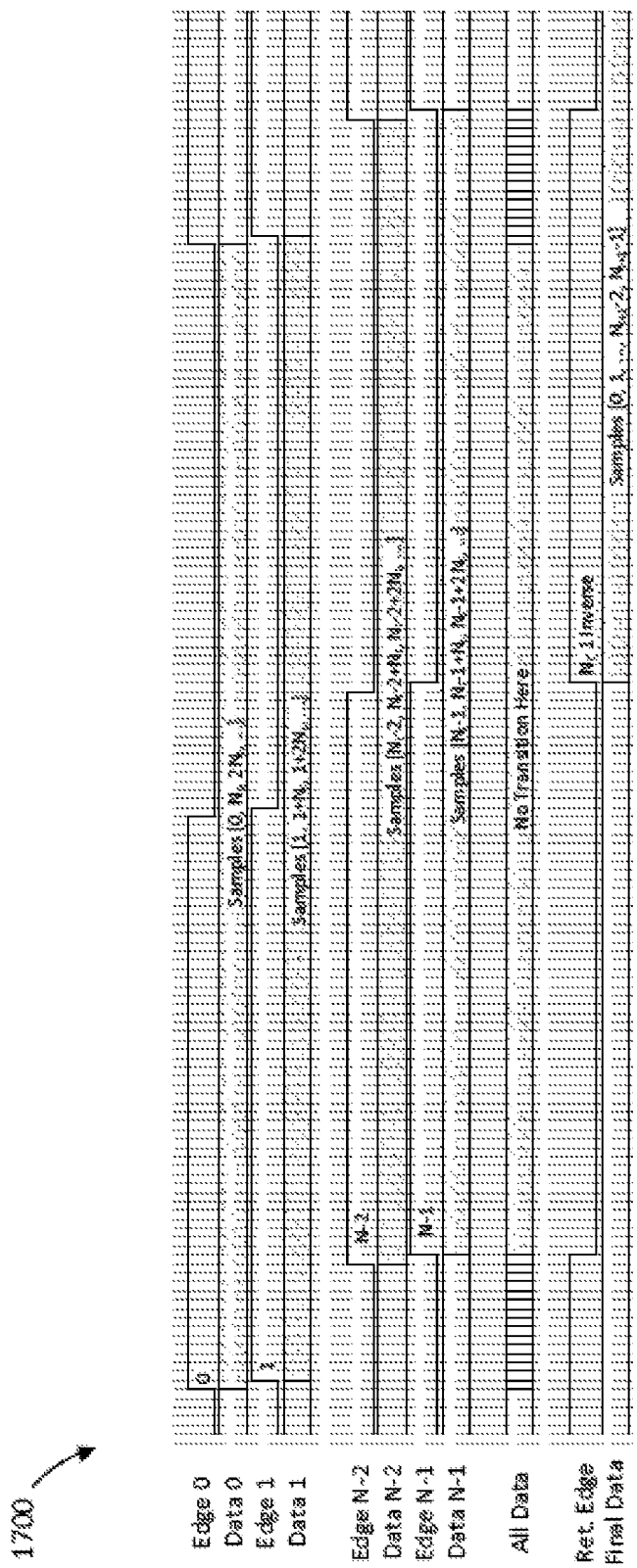
FIG. 17 is a simplified timing diagram illustrating a method of data synchronization using −1 phase stepping and staggered resampling according to an example of the present invention.

Upon deserializing all row data to single column clocks using the steps described previously, column data will always be correctly ordered in time and are slightly offset in an orderly fashion from each other by one UI, as shown in FIG. 17. FIG. 17 is a simplified timing diagram illustrating a method of data synchronization using −p phase stepping and staggered resampling according to an example of the present invention. For the best margin, we use the inverse of the last column clock ($K_i-1$) to retime once again at the final layer so that all column data can be combined in a single correctly ordered data packet. As a rule of thumb, the earliest sample (sample 0) of every column (recall each column has K samples) indexes the correct data order number in absolute time of the final output. For example, consider the output of the structure in FIG. 14, which consists of 128 outputs. In this case, sample 0 of column 15 is the 15th sample, and sample 0 of column 4 is the $4^{th}$ sample in the final data output packet.

In an example, the multi-layer TI system discussed previously can include an interface retimer device configured to synchronize all of the outputs from the fine-grain propagation device and the barrel-shifting device (i.e., the plurality of fine-grain clock signals and all pluralities of barrel-shifted clock signals derived from each of the plurality of fine-grain clock signals), which are synchronized properly in time. All of these output clock signals are received by a plurality of interleavers or sub-converters coupled to the fine-grain propagation and barrel-shifting devices. The interface retimer device coupled to the interleavers or sub-converters is configured to synchronize all the outputs in the correct order and updated on a single clock edge using staggered resampling and −p phase stepping as described above.

In an example, the interface retimer device is configured to synchronize all data outputs for each layer of the TI system and then to synchronize the data from all layers of the TI system. By outputting the resulting synchronized data packet, the TI system provides a simple interface to external devices and systems. Those of ordinary skill in the art will recognize other variations, modifications, and alternatives.

Figure 18:
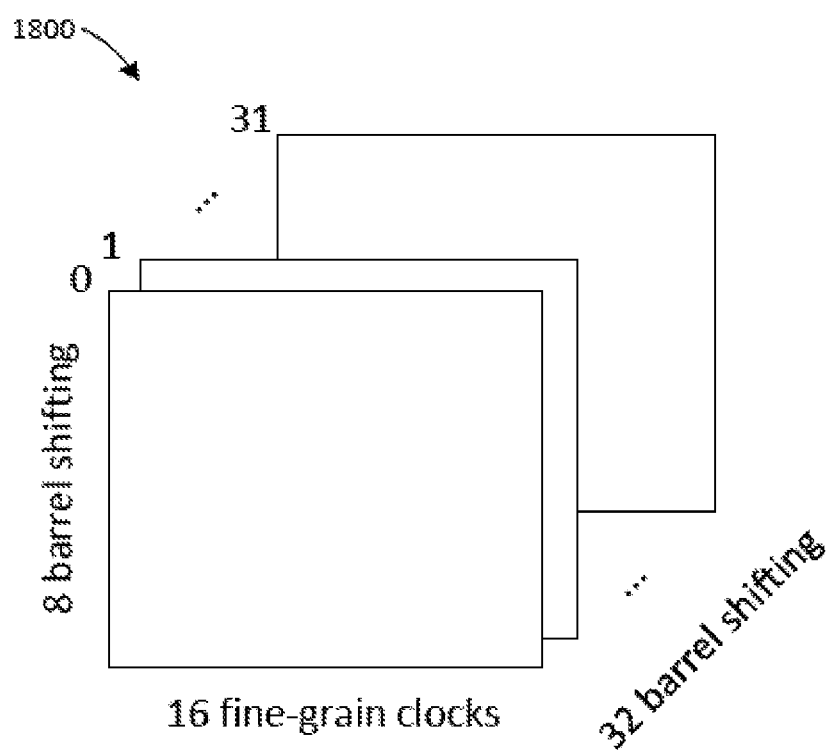
FIG. 18 is a simplified block diagram illustrating a 3D interleaving network having a 4-4-8-32 network topology according to an example of the present invention.

Generalization to N-Dimensional TI System:

Consider a 3D interleaving network having a topology of a 4-4-8-32 network, as shown in FIG. 18. FIG. 18 is a simplified block diagram illustrating a 3D interleaving network 1800 having a 4-4-8-32 network topology according to an example of the present invention. The previous sections showed an example 2D design for a 4-4-8 network, which can be extended into a third dimension to accommodate a third layer of interleavers. In an example, the third layer of interleavers is represented as additional 2D planes attached to the back of the first 4-4-8 plane to create a 4-4-8-32 interleaving cubic system. The first layer is the fine-grain layer (additional fine-grain layers can be implemented), since this interface contains the highest speed clocks, and the second layer is a barrel-shifted layer. We can imagine the third layer, along the z-dimension, as substituting or barrel-shifting different 2D planes of the first two dimensions into focus over time. In an example, Thus, ultimately, this is equivalent to collecting data of the first 2D plane, then the second, then the third, and so on. Therefore, to combine all output data of this structure, we merely capture chronologically the outputs of plane 0, 1, 2, . . . etc. over time until we walk through all the interleaving layers.

Thus, to generalize to an N-dimensional TI system (where N>2), as in FIG. 2, the design strategy according to an example of the present invention is as follows:

1. Determine the number of fine-grain interleavers to best meet the system's overall requirements based on design parameters, such as power, physical limitations, other constrains, and the like (e.g., 16 fine-grain);
2. For the first two interleaving dimensions, apply the previously described techniques to create the first and highest speed TI layer having the determined number of fine-grain interleavers and time interleave the second layer using the barrel shifter technique on the fine-grain interleavers (e.g., 4-4-8);
3. For all other higher dimensions (>3), apply the barrel shifter technique to time interleave the rest of the sub-converters (e.g., 4-4-8-32);
4. Synchronize each layer n (from 0 to N−1) of the N-dimensional TI system using the generalized synchronization technique.

The above sequence of steps is used to design an N-layer TI system to according to an embodiment of the present invention. Depending upon the embodiment, one or more of these steps can be combined, or removed, or other steps may be added without departing from the scope of the claims herein. One of ordinary skill in the art would recognize other variations, modifications, and alternatives.

In an example, the multi-layer TI system discussed previously can include additional barrel-shifting devices to time interleave the initial two layers (i.e., the first "plane") to produce one or more additional layers (i.e., higher dimensions). In a specific example, each of the divider output clocks from the first and second layers of the TI system are coupled to a barrel-shifting device. Each of these barrel-shifting devices includes a propagation retimer chain having a number of propagation retimers corresponding to the number of higher dimensions beyond the first plane (e.g., 32 in the 4-4-8-32 example). These barrel-shifting devices produce all of the remaining divider output clocks by barrel-shifting the divider output clocks of the first plane. Afterwards, all of the divider output clocks of the multi-layer TI system can be synchronized in the correct order and updated on a single clock edge using staggered resampling and −p phase stepping using an interface retimer device.

In a specific example, the additional barrel shifting devices are configured to barrel-shift only the fine-grain clock signals to produce the additional layers of higher dimension barrel-shifter clocks. This can include barrel-shifting the outputs of a multi-dimensional fine-grain clock divider. In another example, the additional barrel shifting devices can also barrel-shift other barrel-shifted clock signals. Of course, there can be other variations, modifications, and alternatives.

As an example of the above 3D system, consider an image processing system with a dimension of 16-8-32, comprising a total of 4096 image sensors. Here, the 16 fine-grain clocks assure that the system can capture rapidly changing images. The rotation of 32 different image sensor planes into focus via barrel shifting, on the other hand, ensures that each image sensor has sufficient time to process and digitize the captured images in high resolution. This system is equivalent to, instead of capturing a single image, capturing a short film of 32 photos of superior quality, thereby greatly improving the capability of the neural computer behind these image sensors.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A multi-layer time-interleaving (TI) device, the device comprising:
a plurality of TI layers configured to receive a plurality of input clock signals and to output a plurality of output clock signals, the plurality of TI layers including at least a first TI layer and a second TI layer, the plurality of TI layers including at least a first layer and a second layer;
wherein the first layer includes a fine-grain propagation device, the fine-grain propagation device comprising a divider and a first plurality of retimers, the divider being configured to produce a plurality of divided clock signals from the plurality of input clock signals, and the first plurality of retimers being configured to produce a plurality of fine-grain clock signals from the plurality of divided clock signals; and
wherein the second layer includes a barrel-shifting propagation device, the barrel-shifting propagation device including a plurality of propagation retimer chains, each of the plurality of propagation retimer chains including a plurality of propagation retimers configured to receive one of the plurality of fine-grain clock signals and to produce a plurality of barrel-shifted clock signals.

2. The device of claim 1 wherein the fine-grain propagation device is configured to produce the plurality of fine-grain clock signals using negative phase stepping.

3. The device of claim 2 wherein the fine-grain propagation device is configured to use a negative phase stepping with a stepping value of one or any odd number in the case that the plurality of input clock signals has an even number of input clock signals and to use a negative phase stepping of a determined stepping value in the case that the plurality of input clock signals has an odd number of input clock signals, the determined stepping value being the smallest positive integer value such that a result of a function L mod (M−p) is odd, where "L" represents a total number of output clock signals in the plurality of output clock signals, "M" represents a total number of input clock signals in the plurality of input clock signals, and "p" represents the stepping value.

4. The device of claim 1 further comprising an interface retimer device coupled to the plurality of TI layers, the interface retimer device being configured to synchronize the plurality of fine-grain clock signals and all pluralities of barrel-shifted clock signals using staggered resampling and negative phase stepping to produce the plurality of output clock signals.

5. The device of claim 4 further comprising a digital timing logic (DTL) device coupled to the interface retimer device, the DTL device being configured to combine the plurality of output clock signals into a single data packet.

6. The device of claim 1 wherein the plurality of TI layers includes one or more higher dimension TI layers having a plurality of barrel-shifting propagation devices coupled to the first TI layer, each of the plurality of barrel-shifting propagation devices of the one or more higher dimension TI layers being configured to receive one of the plurality of fine-grain clock signals and to produce a plurality of higher dimension barrel-shifted clock signals.

7. The device of claim 6 further comprising an interface retimer device coupled to the plurality of TI layers, the interface retimer device being configured to synchronize the plurality of fine-grain clock signals, all pluralities of barrel-shifted clock signals, and all pluralities of higher dimension barrel-shifted clock signals using staggered resampling and negative phase stepping to produce the plurality of output clock signals.

8. The device of claim 1 wherein the plurality of TI layers includes one or more higher dimension TI layers having a plurality of fine-grain propagation devices coupled to the second TI layer, each of the plurality of fine-grain propagation devices of the one or more higher dimension TI layers being configured to produce a plurality of higher dimension fine-grain clock signals, and the barrel-shifting propagation device of the second TI layer being configured to produce a plurality of higher dimension barrel-shifted clock signals from each of the pluralities of higher dimension fine-grain clock signals.

9. The device of claim 8 further comprising an interface retimer device coupled to the plurality of TI layers, the interface retimer device being configured to synchronize the plurality of fine-grain clock signals, all pluralities of higher dimension fine-grain clock signals, all pluralities of barrel-shifted clock signals, and all pluralities of higher dimension barrel-shifted clock signals using staggered resampling and negative phase stepping to produce the plurality of output clock signals.

10. The device of claim 1 further comprising a plurality of sub-converters,
wherein each of the plurality of sub-converters is coupled to one of the plurality of output clock signals.

11. A method of operating a multi-layer time-interleaving (TI) system having a plurality of TI layers with at least a first TI layer and a second TI layer, the method comprising:
producing, by a fine-grain propagation device of the first TI layer, a plurality of fine-grain clock signals from a plurality of input clock signals; and
producing, by a barrel-shifting propagation device of the second TI layer, a plurality of barrel-shifted clock signals from each of the plurality of fine-grain clock signals.

12. The method of claim 11 wherein producing the plurality of fine-grain clock signals comprises producing the plurality of fine-grain clock signals characterized by a timing margin determined by negative phase stepping.

13. The method of claim 12 wherein producing the plurality of fine-grain clock signals characterized by the timing margin determined by negative phase stepping comprises determining the timing margin using negative phase stepping with a stepping value of one or any odd number in the case that the plurality of input clock signals has an even number of input clock signals and using negative phase stepping with a determined stepping value in the case that the plurality of input clock signals has an odd number of input clock signals, the determined stepping value being the smallest positive integer value such that a result of a function L mod (M−p) is odd, where "L" represents a total number of output clock signals in a plurality of output clock signals, "M" represents a total number of input clock signals in the plurality of input clock signals, and "p" represents the stepping value.

14. The method of claim 11 further comprising
synchronizing, by an interface retimer device coupled to the plurality of TI layers, the plurality of fine-grain clock signals and all pluralities of barrel-shifted clock signals using staggered resampling and negative phase stepping to produce a plurality of output clock signals.

15. The method of claim 14 further comprising
combining, by a digital timing logic (DTL) device coupled to the interface retimer device, the plurality of output clock signals into a single data packet.

16. The method of claim 15 further comprising
synchronizing, by the interface retimer device coupled to the plurality of TI layers, the plurality of fine-grain clock signals, all pluralities of barrel-shifted clock signals, and all pluralities of higher dimension barrel-shifted clock signals using staggered resampling and negative phase stepping to produce the plurality of output clock signals.

17. The method of claim 11 wherein the plurality of TI layers comprises one or more higher dimension TI layers having a plurality of barrel-shifting propagation devices coupled to the first and second TI layers; and further comprising
receiving, by each of the plurality of barrel-shifting propagation devices of the one or more higher dimension TI layers, one of the plurality of fine-grain clock signals or one of the pluralities of barrel-shifted clock signals; and
producing, by the plurality of barrel-shifting propagation devices of the one or more higher dimension TI layers, a plurality of higher dimension barrel-shifted clock signals from each of the plurality of fine-grain clock signals.

18. The method of claim 16 further comprising
synchronizing, by the interface retimer device coupled to the plurality of TI layers, the plurality of fine-grain clock signals, all pluralities of higher dimension fine-grain clock signals, the plurality of barrel-shifted clock signals, and all pluralities of higher dimension barrel-shifted clock signals using staggered resampling and negative phase stepping to produce the plurality of output clock signals.

19. The method of claim 11 wherein the plurality of TI layers comprises one or more higher dimension TI layers having a plurality of fine-grain propagation devices coupled to the second TI layer; and further comprising
producing, by each of the plurality of fine-grain propagation devices of the one or more higher dimension TI layers, a plurality of higher dimension fine-grain clock signals; and
producing, by the barrel-shifting propagation device of the second TI layer, a plurality of higher dimension barrel-shifted clock signals from each of the pluralities of higher dimension fine-grain clock signals.

20. The method of claim 11 further comprising outputting, by the multi-layer TI system, a plurality of output clock signals to a plurality of sub-converters.

* * * * *